(12) United States Patent
Simard

(10) Patent No.: US 11,486,776 B2
(45) Date of Patent: Nov. 1, 2022

(54) DUAL-BAND MAGNETOELASTIC TORQUE SENSOR

(71) Applicant: Kongsberg Inc., Shawinigan (CA)

(72) Inventor: Guillaume Simard, Laval (CA)

(73) Assignee: Kongsberg Inc., Shawinigan (CA)

( * ) Notice: Subject to any disclaimer, the term of this patent is extended or adjusted under 35 U.S.C. 154(b) by 721 days.

(21) Appl. No.: 16/468,584

(22) PCT Filed: Dec. 12, 2017

(86) PCT No.: PCT/IB2017/057858
§ 371 (c)(1),
(2) Date: Jun. 11, 2019

(87) PCT Pub. No.: WO2018/109674
PCT Pub. Date: Jun. 21, 2018

(65) Prior Publication Data
US 2020/0088594 A1 Mar. 19, 2020

Related U.S. Application Data

(60) Provisional application No. 62/433,073, filed on Dec. 12, 2016.

(51) Int. Cl.
*G01L 3/10* (2006.01)
*G01L 5/00* (2006.01)
(Continued)

(52) U.S. Cl.
CPC ............ *G01L 3/101* (2013.01); *G01L 5/0023* (2013.01); *G01L 5/13* (2013.01); *G01L 5/221* (2013.01); *G01R 33/072* (2013.01)

(58) Field of Classification Search
CPC . G01L 3/102; G01L 3/105; G01L 3/10; G01L 1/125; G01L 5/0023; G01L 5/13; G01L 5/221; G01R 33/072
(Continued)

(56) References Cited

U.S. PATENT DOCUMENTS 3,263,796 A 8/1966 Parke
4,656,750 A 4/1987 Pitt et al.
(Continued)

FOREIGN PATENT DOCUMENTS

CA 2073293 C 11/1996
CN 2903949 Y 5/2007
(Continued)

OTHER PUBLICATIONS

English language abstract for JPH0545240A extracted from espacenet.com database on Aug. 1, 2019, 1 page.
(Continued)

*Primary Examiner* — Octavia Davis Hollington
(74) *Attorney, Agent, or Firm* — Howard & Howard Attorneys PLLC

(57) ABSTRACT

A torque sensor is provided. The torque sensor includes a shaft configured to receive an applied torque. The shaft includes a first region and a second region, both regions being magnetoelastic. The first region and the second region generate a first magnetic field and a second magnetic field in response to the applied torque. The shaft also includes a third region disposed between the first region and the second region. The third region generates a substantially negligible magnetic field in response to the applied torque. The torque sensor also includes a first sensor disposed adjacent to the first region, a second sensor disposed adjacent to the second region, and a third sensor disposed adjacent the third region. The first sensor senses the first magnetic field, the second sensor senses the second magnetic field, and the third sensor senses an ambient magnetic field.

20 Claims, 8 Drawing Sheets

(51) Int. Cl.
  *G01L 5/13* (2006.01)
  *G01L 5/22* (2006.01)
  *G01R 33/07* (2006.01)

(58) Field of Classification Search
  USPC .................................................. 73/862.193
  See application file for complete search history.

(56) References Cited

U.S. PATENT DOCUMENTS

| | | | |
|---|---|---|---|
| 4,760,745 A | 8/1988 | Garshelis | |
| 4,882,936 A | 11/1989 | Garshelis | |
| 4,896,544 A | 1/1990 | Garshelis | |
| 4,989,460 A | 2/1991 | Mizuno et al. | |
| 5,052,232 A | 10/1991 | Garshelis | |
| 5,307,690 A | 5/1994 | Hanazawa | |
| 5,321,985 A | 6/1994 | Kashiwagi et al. | |
| 5,351,555 A | 10/1994 | Garshelis | |
| 5,419,207 A | 5/1995 | Kobayashi et al. | |
| 5,465,627 A | 11/1995 | Garshelis | |
| 5,520,059 A | 5/1996 | Garshelis | |
| 5,522,269 A | 6/1996 | Takeda et al. | |
| 5,526,704 A | 6/1996 | Hoshina et al. | |
| 5,562,004 A | 10/1996 | Kaise et al. | |
| 5,589,645 A | 12/1996 | Kobayashi et al. | |
| 5,591,925 A | 1/1997 | Garshelis | |
| 5,706,572 A | 1/1998 | Garshelis | |
| 5,708,216 A | 1/1998 | Garshelis | |
| 5,887,335 A | 3/1999 | Garshelis | |
| 5,939,881 A | 8/1999 | Slater et al. | |
| 6,047,605 A | 4/2000 | Garshelis | |
| 6,145,387 A | 11/2000 | Garshelis | |
| 6,222,363 B1 | 4/2001 | Cripe | |
| 6,260,423 B1 | 7/2001 | Garshelis | |
| 6,278,271 B1 | 8/2001 | Schott | |
| 6,341,534 B1 | 1/2002 | Dombrowski | |
| 6,490,934 B2 | 12/2002 | Garshelis | |
| 6,499,559 B2 | 12/2002 | McCann et al. | |
| 6,522,130 B1 | 2/2003 | Lutz | |
| 6,553,847 B2 | 4/2003 | Garshelis | |
| 6,581,480 B1 | 6/2003 | May et al. | |
| 6,768,301 B1 | 7/2004 | Hohe et al. | |
| 6,807,871 B1 | 10/2004 | Paek | |
| 6,810,754 B2 | 11/2004 | May | |
| 6,826,969 B1* | 12/2004 | May | G01L 3/102 73/862.339 |
| 7,117,752 B2 | 10/2006 | May | |
| 7,124,649 B2 | 10/2006 | May | |
| 7,235,968 B2 | 6/2007 | Popovic et al. | |
| 7,263,904 B2 | 9/2007 | Koshida et al. | |
| 7,302,867 B2 | 12/2007 | May | |
| 7,305,882 B1 | 12/2007 | May | |
| 7,308,835 B2 | 12/2007 | Cripe | |
| 7,362,096 B2 | 4/2008 | Oberdier et al. | |
| 7,363,827 B2 | 4/2008 | Hedayat et al. | |
| 7,389,702 B2 | 6/2008 | Ouyang et al. | |
| 7,391,211 B2 | 6/2008 | Cripe | |
| 7,409,878 B2 | 8/2008 | Von Beck et al. | |
| 7,469,604 B2 | 12/2008 | Hedayat et al. | |
| 7,506,554 B2 | 3/2009 | Shimizu et al. | |
| 7,845,243 B2 | 12/2010 | Poirier et al. | |
| 7,895,906 B2 | 3/2011 | Hedayat et al. | |
| 7,969,148 B2 | 6/2011 | Noguchi et al. | |
| 8,001,849 B2 | 8/2011 | Weng | |
| 8,001,850 B2 | 8/2011 | Hedayat et al. | |
| 8,087,304 B2 | 1/2012 | Lee | |
| 8,181,538 B2 | 5/2012 | Yamamura et al. | |
| 8,191,431 B2 | 6/2012 | Hedayat et al. | |
| 8,203,334 B2 | 6/2012 | Baller et al. | |
| 8,316,724 B2 | 11/2012 | Ling et al. | |
| 8,373,410 B2 | 2/2013 | Frachon | |
| 8,424,393 B1 | 4/2013 | Lee | |
| 8,468,898 B2 | 6/2013 | Baller et al. | |
| 8,578,794 B2 | 11/2013 | Lee | |
| 8,635,917 B2 | 1/2014 | Lee | |
| 8,677,835 B2 | 3/2014 | Goto et al. | |
| 8,701,503 B2 | 4/2014 | Shimizu et al. | |
| 8,707,824 B2 | 4/2014 | Benkert et al. | |
| 8,836,458 B2 | 9/2014 | Lee | |
| 8,844,379 B2 | 9/2014 | Pietron et al. | |
| 8,890,514 B2 | 11/2014 | Masson et al. | |
| 8,893,562 B2 | 11/2014 | Barraco et al. | |
| 9,024,622 B2 | 5/2015 | Hohe et al. | |
| 9,151,686 B2 | 10/2015 | Barraco et al. | |
| 9,254,863 B2 | 2/2016 | Kuwahara et al. | |
| 9,284,998 B2 | 3/2016 | Gießibl | |
| 9,347,845 B2 | 5/2016 | Gießibl | |
| 9,494,661 B2 | 11/2016 | Paul et al. | |
| 9,575,141 B2 | 2/2017 | Rohrer | |
| 9,593,990 B2 | 3/2017 | Duan et al. | |
| 9,683,906 B2 | 6/2017 | Gießibl | |
| 10,151,652 B2 | 12/2018 | Gießibl | |
| 2001/0029791 A1 | 10/2001 | Sezaki | |
| 2004/0119470 A1 | 6/2004 | Yajima et al. | |
| 2005/0204830 A1 | 9/2005 | Kuroda et al. | |
| 2005/0204831 A1 | 9/2005 | Mori et al. | |
| 2007/0028709 A1 | 2/2007 | Futamura et al. | |
| 2007/0034021 A1 | 2/2007 | Cripe | |
| 2007/0096724 A1 | 5/2007 | Oberdier et al. | |
| 2008/0048179 A1 | 2/2008 | Shin et al. | |
| 2008/0221399 A1 | 9/2008 | Zhou et al. | |
| 2009/0072818 A1 | 3/2009 | Mizuno et al. | |
| 2010/0097059 A1 | 4/2010 | Estrada et al. | |
| 2010/0156394 A1 | 6/2010 | Ausserlechner et al. | |
| 2010/0328799 A1 | 12/2010 | Braganca et al. | |
| 2011/0106557 A1 | 5/2011 | Gazula | |
| 2011/0162464 A1 | 7/2011 | Weng | |
| 2012/0007597 A1 | 1/2012 | Seeger et al. | |
| 2012/0007598 A1 | 1/2012 | Lo et al. | |
| 2012/0296577 A1 | 11/2012 | Garshelis et al. | |
| 2013/0125669 A1 | 5/2013 | Barraco et al. | |
| 2013/0181702 A1 | 7/2013 | May | |
| 2013/0218517 A1 | 8/2013 | Ausserlechner | |
| 2013/0285651 A1 | 10/2013 | Wan et al. | |
| 2014/0195117 A1 | 7/2014 | Kuwahara et al. | |
| 2014/0197820 A1 | 7/2014 | Ritter et al. | |
| 2014/0197822 A1 | 7/2014 | Ritter et al. | |
| 2014/0354270 A1 | 12/2014 | Kawano et al. | |
| 2015/0057885 A1 | 2/2015 | Brady et al. | |
| 2015/0230294 A1 | 8/2015 | Tonomura et al. | |
| 2015/0253162 A1 | 9/2015 | Kusumi et al. | |
| 2015/0274204 A1 | 10/2015 | Shiraishi et al. | |
| 2016/0121924 A1 | 5/2016 | Norstad | |
| 2016/0238472 A1 | 8/2016 | Gießibl | |
| 2017/0324930 A1 | 11/2017 | Shaya | |
| 2017/0356822 A1 | 12/2017 | Gieß ibl | |
| 2017/0370788 A1 | 12/2017 | Neuschaefer-Rube et al. | |
| 2018/0231425 A1 | 8/2018 | Raths Ponce et al. | |
| 2019/0178683 A1 | 6/2019 | Tetreault et al. | |
| 2020/0088594 A1 | 3/2020 | Simard | |
| 2021/0229679 A1* | 7/2021 | Gießibl | B60W 30/18027 |
| 2022/0034734 A1* | 2/2022 | Veillette | G01L 3/102 |

FOREIGN PATENT DOCUMENTS

| | | |
|---|---|---|
| CN | 102519633 A | 6/2012 |
| CN | 105277303 A | 1/2016 |
| DE | 3206503 C1 | 8/1983 |
| DE | 102010033308 A1 | 2/2012 |
| DE | 102015202240 B3 | 2/2016 |
| EP | 0067974 A2 | 12/1982 |
| EP | 0217640 A2 | 4/1987 |
| EP | 0362890 A2 | 4/1990 |
| EP | 0609463 A1 | 8/1994 |
| EP | 0697602 A2 | 2/1996 |
| EP | 0947846 A2 | 10/1999 |
| EP | 0979988 A1 | 2/2000 |
| EP | 1206707 A1 | 5/2002 |
| EP | 1211494 A1 | 6/2002 |
| EP | 1243905 A1 | 9/2002 |
| EP | 1319934 A2 | 6/2003 |
| EP | 1400795 A1 | 3/2004 |
| EP | 1518131 A1 | 3/2005 |
| EP | 1668378 A1 | 6/2006 |
| EP | 1795864 A1 | 6/2007 |

(56) References Cited

FOREIGN PATENT DOCUMENTS

| | | |
|---|---|---|
| EP | 1949057 A2 | 7/2008 |
| EP | 1950545 A2 | 7/2008 |
| EP | 2049910 A2 | 4/2009 |
| EP | 2260278 A2 | 12/2010 |
| EP | 2065691 B1 | 12/2011 |
| EP | 2447690 A2 | 5/2012 |
| EP | 2527857 A2 | 11/2012 |
| EP | 1386127 B1 | 1/2013 |
| EP | 2766740 A1 | 8/2014 |
| EP | 2793009 A1 | 10/2014 |
| EP | 2799327 A1 | 11/2014 |
| EP | 2799827 A1 | 11/2014 |
| EP | 2806283 A2 | 11/2014 |
| EP | 3256828 B1 | 7/2019 |
| JP | S6141935 A | 2/1986 |
| JP | H0116349 B2 | 3/1989 |
| JP | H01187425 A | 7/1989 |
| JP | H02280023 A | 11/1990 |
| JP | H02280024 A | 11/1990 |
| JP | H041542 A | 1/1992 |
| JP | H04191630 A | 7/1992 |
| JP | H0545240 A | 2/1993 |
| JP | H05066164 A | 3/1993 |
| JP | H05126654 A | 5/1993 |
| JP | H0540849 U | 6/1993 |
| JP | H0543040 U | 6/1993 |
| JP | H0545537 U | 6/1993 |
| JP | H05045538 U | 6/1993 |
| JP | H05231966 A | 9/1993 |
| JP | H05231967 A | 9/1993 |
| JP | H05346360 A | 12/1993 |
| JP | H06014939 U | 2/1994 |
| JP | H0674844 A | 3/1994 |
| JP | H0628673 U | 4/1994 |
| JP | H06047832 U | 6/1994 |
| JP | H06258158 A | 9/1994 |
| JP | H06300647 A | 10/1994 |
| JP | H06323930 A | 11/1994 |
| JP | H072943 U | 1/1995 |
| JP | H0780756 A | 3/1995 |
| JP | H07159258 A | 6/1995 |
| JP | H0743521 U | 8/1995 |
| JP | H085477 A | 1/1996 |
| JP | H08043216 A | 2/1996 |
| JP | H08293634 A | 11/1996 |
| JP | H0985587 A | 3/1997 |
| JP | H0995247 A | 4/1997 |
| JP | H09189624 A | 7/1997 |
| JP | 2001050830 A | 2/2001 |
| JP | 2002333375 A | 11/2002 |
| JP | 2002340701 A | 11/2002 |
| JP | 2003307460 A | 10/2003 |
| JP | 2004053433 A | 2/2004 |
| JP | 2004053434 A | 2/2004 |
| JP | 2004053435 A | 2/2004 |
| JP | 2004225096 A | 8/2004 |
| JP | 2004264188 A | 9/2004 |
| JP | 2005321272 A | 11/2005 |
| JP | 2006010669 A | 1/2006 |
| JP | 2006126130 A | 5/2006 |
| JP | 2007101427 A | 4/2007 |
| JP | 2007181327 A | 7/2007 |
| JP | 2008026160 A | 2/2008 |
| JP | 2009122042 A | 6/2009 |
| JP | 2013053954 A | 3/2013 |
| JP | 2013053957 A | 3/2013 |
| JP | 2015009602 A | 1/2015 |
| JP | 2015010870 A | 1/2015 |
| JP | 6071460 B2 * | 2/2017 ............ G01L 3/102 |
| KR | 20050075880 A | 7/2005 |
| KR | 20050093025 A | 9/2005 |
| KR | 20060054775 A | 5/2006 |
| KR | 20070004377 A | 1/2007 |
| WO | 9533982 A1 | 12/1995 |
| WO | 200118556 A1 | 3/2001 |
| WO | 200192906 A2 | 12/2001 |
| WO | 2003006922 A1 | 1/2003 |
| WO | 03071232 A1 | 8/2003 |
| WO | 200405873 A1 | 1/2004 |
| WO | 2004003585 A1 | 1/2004 |
| WO | 2005029106 A1 | 3/2005 |
| WO | 200554803 A1 | 6/2005 |
| WO | 2007092402 A2 | 8/2007 |
| WO | 2008017348 A2 | 2/2008 |
| WO | 2011119317 A1 | 9/2011 |
| WO | 2012016664 A2 | 2/2012 |
| WO | 2013053534 A1 | 4/2013 |
| WO | 2017199063 A1 | 11/2017 |
| WO | 2017214361 A1 | 12/2017 |
| WO | 2018109674 A1 | 6/2018 |

OTHER PUBLICATIONS

English language abstract for JPH0566164A extracted from espacenet.com database on Aug. 1, 2019, 1 page.
English language abstract for JPH06258158A extracted from espacenet.com database on Aug. 1, 2019, 1 page.
English language abstract for JPH06300647A extracted from espacenet.com database on Aug. 1, 2019, 1 page.
English language abstract for JPH06323930A extracted from espacenet.com database on Aug. 1, 2019, 1 page.
English language abstract for JPH0674844A extracted from espacenet.com database on Aug. 1, 2019, 1 page.
English language abstract for JPH07159258A extracted from espacenet.com database on Aug. 1, 2019, 1 page.
English language abstract for JPH0780756A extracted from espacenet.com database on Aug. 1, 2019, 1 page.
English language abstract for JPH0843216A extracted from espacenet.com database on Aug. 1, 2019, 1 page.
English language abstract for JPH085477A extracted from espacenet.com database on Aug. 1, 2019, 1 page.
English language abstract for JPH09189624A extracted from espacenet.com database on Aug. 1, 2019, 1 page.
English language abstract for JPH0985587A extracted from espacenet.com database on Aug. 1, 2019, 1 page.
English language abstract for JPH0995247A extracted from espacenet.com database on Aug. 1, 2019, 1 page.
English language abstract for JPS6141935A extracted from espacenet.com database on Aug. 1, 2019, 1 page.
English language abstract for KR20070004377A extracted from espacenet.com database on Aug. 1, 2019, 1 page.
English language abstract for WO0118556A1 extracted from espacenet.com database on Jan. 7, 2019, 2 pages.
English language abstract for WO2004005873A1 extracted from espacenet.com database on Aug. 1, 2019, 2 pages.
English language abstract for WO2005029106A1 extracted from espacenet.com database on Jan. 7, 2019, 2 pages.
English language abstract for WO2005054803A1 extracted from espacenet.com database on Aug. 1, 2019, 2 pages.
English language abstract for WO2008017348A2 extracted from espacenet.com database on Jan. 7, 2019, 2 pages.
English language abstract for WO2013053534A1 extracted from espacenet.com database on Jan. 7, 2019, 1 page.
International Search Report for Application No. PCT/IB2016/052876 dated Jan. 19, 2017, 4 pages.
International Search Report for Application No. PCT/IB2017/057858 dated Mar. 29, 2018, 5 pages.
Melexis, "MLX90316—Rotary Position Sensor IC Data Sheet", 3901090316, Rev. 10, Jul. 2013, 45 pages.
Melexis, "MLX90333—Position Sensor Data Sheet", Revision 008, Sep. 26, 2017, 48 pages.
Melexis, "MLX90363—Triaxis Magnetometer IC With High Speed Serial Interface Data Sheet", 3901090363, Rev. 005, Jul. 2013, 57 pages.
Moving Magnet Technologies SA (MMT), "Magnetic Field Angle Position Sensors and Rotary Sensors", http://www.movingmagnet.com/en/analog-magnetic-field-angle-measurement/, 2016, 1 page.

(56) References Cited

OTHER PUBLICATIONS

Poincare, Jules Henri, "Exploring Magnetism—Session 1: Magnetism", http://cse.ssl.berkeley.edu/SegwayEd/lessons/exploring_magnetism/Exploring_Magnetism/s1.html, 2016, 6 pages.
Regents of the University of California Berkeley, "Exploring Magnetism—Session 1", http://cse.ssl.berkeley.edu/SegwayEd/lessons/exploring_magnetism/Exploring_Magnetism/s1.html, 2005, 6 pages.
U.S. Appl. No. 16/244,744, filed Jan. 10, 2019.
U.S. Appl. No. 62/433,073, filed Dec. 1, 2016.
Banks, Kevin, "The Goertzel Algorithm", Aug. 28, 2002, https://www.embedded.com/design/configurable-systems/4024443/The-Goertzel-Algorithm#, 5 pages.
Computer-Assisted English language abstract for EP2806283A2 extracted from espacenet.com database on Jan. 7, 2019, 4 pages.
Computer-generated English language translation for JPH0540849U extracted from espacenet.com database on Aug. 1, 2019, 7 pages.
Computer-generated English language translation for JPH0543040U extracted from espacenet.com database on Aug. 1, 2019, 6 pages.
Computer-generated English language translation for JPH0545537U extracted from espacenet.com database on Aug. 1, 2019, 9 pages.
Computer-generated English language translation for JPH0545538U extracted from espacenet.com database on Aug. 1, 2019, 8 pages.
Computer-generated English language translation for JPH0614939U extracted from espacenet.com database on Aug. 1, 2019, 10 pages.
Computer-generated English language translation for JPH0628673U extracted from espacenet.com database on Aug. 1, 2019, 6 pages.
Computer-generated English language translation for JPH0647832U extracted from espacenet.com database on Aug. 1, 2019, 9 pages.
Computer-generated English language translation for JPH072943U extracted from espacenet.com database on Aug. 1, 2019, 8 pages.
Computer-generated English language translation for JPH0743521U extracted from espacenet.com database on Aug. 1, 2019, 8 pages.
Computer-generated English language translation for KR20050075880A extracted from espacenet.com database on Aug. 1, 2019, 4 pages.
Computer-generated English language translation for KR20050093025A extracted from espacenet.com database on Aug. 1, 2019, 4 pages.
Computer-generated English language translation for KR20060054775A extracted from espacenet.com database on Aug. 1, 2019, 4 pages.
English language abstract for CN2903949Y extracted from espacenet.com database on Aug. 1, 2019, 1 page.
English language abstract for DE3206503C1 extracted from espacenet.com database on Aug. 1, 2019, 1 page.
English language abstract for EP1243905A1 extracted from espacenet.com database on Jul. 17, 2019, 1 page.
English language abstract for EP0947846A2 extracted from espacenet.com database on Jan. 7, 2019, 1 page.
English language abstract for EP1243905A1 extracted from espacenet.com database on Aug. 1, 2019, 1 page.
English language abstract for EP1319934a2 extracted from espacenet.com database on Aug. 1, 2019, 2 pages.
English language abstract for JP2001050830A extracted from espacenet.com database on Aug. 1, 2019, 1 page.
English language abstract for JP2002333375A extracted from espacenet.com database on Aug. 1, 2019, 1 page.
English language abstract for JP2002340701A extracted from espacenet.com database on Aug. 1, 2019, 1 page.
English language abstract for JP2003307460A extracted from espacenet.com database on Aug. 1, 2019, 1 page.
English language abstract for JP2004053433A extracted from espacenet.com database on Aug. 1, 2019, 1 page.
English language abstract for JP2004053434A extracted from espacenet.com database on Aug. 1, 2019, 1 page.
English language abstract for JP2004053435A extracted from espacenet.com database on Aug. 1, 2019, 1 page.
English language abstract for JP2004225096A extracted from espacenet.com database on Aug. 1, 2019, 1 page.
English language abstract for JP2004264188A extracted from espacenet.com database on Aug. 1, 2019, 1 page.
English language abstract for JP2005321272A extracted from espacenet.com database on Aug. 1, 2019, 1 page.
English language abstract for JP2006010669A extracted from espacenet.com database on Aug. 1, 2019, 1 page.
English language abstract for JP2006126130A extracted from espacenet.com database on Aug. 1, 2019, 1 page.
English language abstract for JP2007101427A extracted from espacenet.com database on Aug. 1, 2019, 1 page.
English language abstract for JP2007181327A extracted from espacenet.com database on Aug. 1, 2019, 1 page.
English language abstract for JP2008026160A extracted from espacenet.com database on Aug. 1, 2019, 1 page.
English language abstract for JP2009122042A extracted from espacenet.com database on Aug. 1, 2019, 1 page.
English language abstract for JP2013053954A extracted from espacenet.com database on Aug. 1, 2019, 1 page.
English language abstract for JP2013053957A extracted from espacenet.com database on Aug. 1, 2019, 1 page.
English language abstract for JP2015009602A extracted from espacenet.com database on Aug. 1, 2019, 1 page.
English language abstract for JP2015010870A extracted from espacenet.com database on Aug. 1, 2019, 1 page.
English language abstract for JPH0116349B2 extracted from espacenet.com database on Aug. 1, 2019, 1 page.
English language abstract for JPH01187425A extracted from espacenet.com database on Aug. 1, 2019, 1 page.
English language abstract for JPH02280023A extracted from espacenet.com database on Aug. 1, 2019, 1 page.
English language abstract for JPH02280024A extracted from espacenet.com database on Aug. 1, 2019, 1 page.
English language abstract for JPH041542A extracted from espacenet.com database on Aug. 1, 2019, 1 page.
English language abstract for JPH04191630A extracted from espacenet.com database on Aug. 1, 2019, 1 page.
English language abstract for JPH05126654A extracted from espacenet.com database on Aug. 1, 2019, 1 page.
English language abstract for JPH05231966A extracted from espacenet.com database on Aug. 1, 2019, 1 page.
English language abstract for JPH05231967A extracted from espacenet.com database on Aug. 1, 2019, 1 page.
English language abstract for JPH05346360A extracted from espacenet.com database on Aug. 1, 2019, 1 page.
Supplementary European Search Report for Application EP 17 88 0586 dated Jun. 23, 2020, 2 pages.
Machine-assisted English language abstract for DE 10 2015 202 240 B3 extracted from espacenet.com database on Jul. 29, 2020, 2 pages.
English language abstract for CN 102519633 A extracted from espacenet.com database on Apr. 25, 2021, 1 page.
English language abstract for CN 1105277303 A extracted from espacenet.com database on Apr. 25, 2021, 1 page.
English language abstract for DE 10 2010 033 308 A1 extracted from espacenet.com database on Apr. 25, 2021, 2 pages.
English language abstract for EP 3 256 828 B1 extracted from espacenet.com database on Apr. 25, 2021, 1 page (see also English language equivalent U.S. 2017/0370788 A1 previously cited in SB08/IDS on Aug. 3, 2020).
English language abstract for JPH 08-293634 A extracted from espacenet.com database on Apr. 25, 2021, 2 pages.
English language abstract for WO 2012/016664 A2 A extracted from espacenet.com database on Apr. 25, 2021, 1 page.
Supplementay European Search Report for Application EP 16 90 2283.7 dated Nov. 18, 2019, 2 pages.
English language abstract for EP 0979 988 A1 extracted from espacenet.com database on Jul. 11, 2022, 1 page.

* cited by examiner

DUAL-BAND MAGNETOELASTIC TORQUE SENSOR

CROSS-REFERENCE TO RELATED APPLICATIONS

The subject application claims the benefit of U.S. Provisional Patent Application No. 62/433,073, filed on Dec. 12, 2016, the entirety of which is hereby incorporated by reference.

CROSS REFERENCE TO RELATED APPLICATIONS

This application is the U.S. National Stage of International Patent Application No. PCT/IB2017/057858, filed on Dec. 12, 2017, the disclosure of which is hereby incorporated by reference.

TECHNICAL FIELD

The present disclosure relates generally to systems, sensors, and methods of measuring applied torque using magnetoelastic techniques.

BACKGROUND

There are many systems and methods for measuring an applied torque using a magnetoelastic torque sensor. The magnetoelastic torque sensor comprises a shaft which receives the applied torque. The shaft comprises a number of magnetic regions, the magnetic characteristics of which change in response to the applied torque. A plurality of sensors is disposed along the shaft, near the magnetic regions, and measure the magnetic fields generated by the magnetic regions. In this way, the torque sensor is able to detect changes in applied torque via the measured magnetic fields.

While these torque sensors have generally worked for their intended purposes, certain disadvantages remain. For example, there remains a need in the art for these torque sensors to be more compact, without sacrificing an ability to accurately sense the magnetic fields or an ability to reject unwanted ambient magnetic field.

As such, there are opportunities to address at least the aforementioned problems.

SUMMARY

One embodiment of a torque sensor is provided. The torque sensor includes a shaft configured to receive an applied torque. The shaft includes a first region and a second region, both regions being magnetoelastic. The first region and the second region are configured to generate a first magnetic field and a second magnetic field in response to the applied torque. The shaft also includes a third region disposed between the first region and the second region. The third region is configured to generate a substantially negligible magnetic field in response to the applied torque. The torque sensor also includes a first sensor disposed adjacent to the first region, a second sensor disposed adjacent to the second region, and a third sensor disposed adjacent the third region. The first sensor is configured to sense the first magnetic field, the second sensor is configured to sense the second magnetic field, and the third sensor is configured to sense an ambient magnetic field.

One embodiment of a method of sensing an applied torque using a torque sensor is provided. The torque sensor includes a shaft, which includes a first region and a second region, both regions being magnetoelastic. The first region and the second region of the shaft are configured to generate a first magnetic field and a second magnetic field in response to the applied torque. The shaft also includes a third region disposed between the first region and the second region. The third region is configured to generate a substantially negligible magnetic field in response to the applied torque. The method includes steps of receiving the applied torque with the shaft of the torque sensor and sensing the first magnetic field, the second magnetic field, and the ambient magnetic field.

One embodiment of a vehicular component for determining a magnitude of an applied torque is provided. The vehicular component includes a mechanism for applying the applied torque and a torque sensor. The torque sensor includes a shaft configured to receive the applied torque, which includes a first region and a second region, both regions being magnetoelastic. The first region and the second region of the shaft are configured to generate a first magnetic field and a second magnetic field in response to the applied torque. The shaft also includes a third region disposed between the first region and the second region. The third region is configured to generate a substantially negligible magnetic field in response to the applied torque. The vehicular component also includes a first sensor disposed adjacent to the first region, a second sensor disposed adjacent to the second region, and a third sensor disposed adjacent the third region. The first sensor is configured to sense the first magnetic field, the second sensor is configured to sense the second magnetic field, and the third sensor is configured to sense an ambient magnetic field. The vehicular component also includes a controller coupled to the first sensor, the second sensor, and the third sensor. The controller being configured to determine the magnitude of the applied torque based on the first magnetic field, the second magnetic field, and the ambient magnetic field.

The arrangement of the first magnetoelastic region, the second magnetoelastic region, and the null-magnetized region allow the torque sensor to be more compact, while maintaining an ability to accurately sense the magnetic fields and reject the ambient magnetic field as well as noise from the ambient magnetic field. The torque sensor, system and method may exhibit other advantages other than those described herein. Other features and advantages of the torque sensor, method, and vehicular component will be readily appreciated as the same becomes better understood by reference to the following detailed description when considered in connection with the accompanying drawings.

BRIEF DESCRIPTION OF THE DRAWINGS

Other advantages of the present disclosure will be readily appreciated, as the same becomes better understood by reference to the following detailed description when considered in connection with the accompanying drawings wherein.

DETAILED DESCRIPTION

I. Torque Sensor Overview

Figure 1:
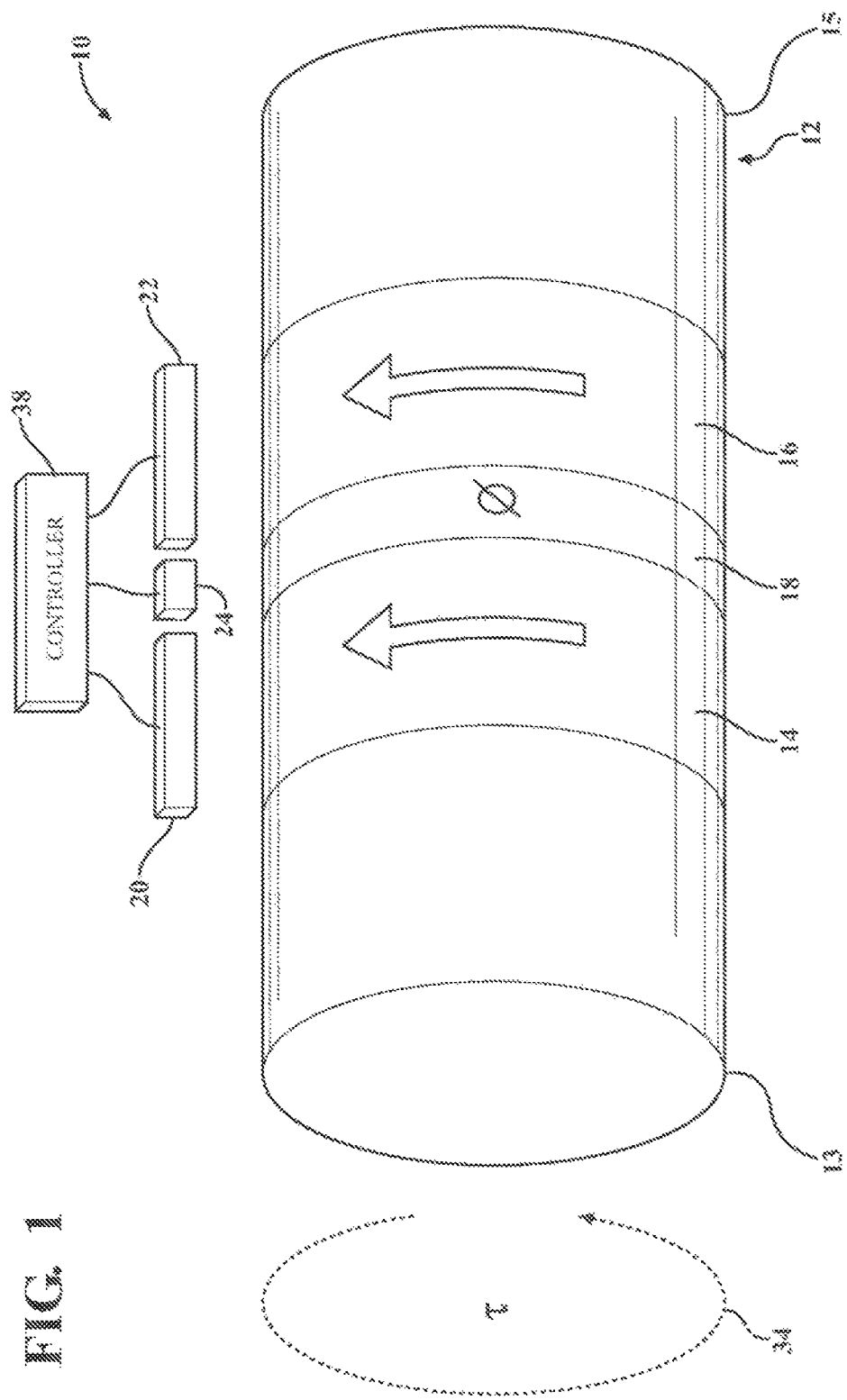
FIG. 1 provides a perspective view of a dual-band torque sensor.

FIG. 1 illustrates one embodiment of a torque sensor 10 for measuring a magnitude of the applied torque 34. The torque sensor 10 may be utilized in suitable applications and for any suitable component or system where the applied torque 34 is measured. For example, the torque sensor 10 may be utilized in, but not limited to, vehicular systems, such as electric power steering systems.

Referring to the embodiment of FIG. 1, the applied torque 34 having magnitude τ is applied to a first end 13 of a shaft 12 of the torque sensor 10. However, the applied torque 34 may be applied to any section of the torque sensor 10. For example, the applied torque 34 may be applied to a second end 15 of the torque sensor 10 or at any point between ends 13, 15 of the torque sensor 10. Furthermore, the applied torque 34 may be applied to more than one section of the torque sensor 10. Additionally, the applied torque 34 may be applied in clockwise or counterclockwise direction when looking at the first end 13 of the torque sensor 10. Depending on the system that utilizes the torque sensor 10, the applied torque 34 may be applied in either or both directions.

Although the shaft 12, as shown in FIG. 1, has a cylindrical configuration, the shaft 12 may have any suitable shape defining any suitable cross-sectional area (e.g. a square, a triangle, an oval, an octagon, etc.) for enabling the torque sensor 10 to properly function. Additionally, in other embodiments, the shaft 12 may be hollow or solid. Furthermore, in some embodiments, the shaft 12 may be stationary and fixed at ends 13, 15 to a larger system, which enables application of the applied torque 34 to deform the shaft 12. In other embodiments, the shaft 12 may rotate upon application of the applied torque 34.

As shown in FIG. 1, the shaft 12 may include a first region 14, which may be magnetoelastic, and a second region 16, which may also be magnetoelastic. A region may be magnetoelastic if the region generates a magnetic field in response to a mechanical force. For example, in the embodiment of FIG. 1, the first region 14 and second region 16 may be magnetized to generate a magnetic field in response to the applied torque 34 being applied to the shaft 12. In some embodiments, the first and second regions 14, 16 may be magnetized circumferentially and may be magnetized to carry a positive or negative polarity. In FIG. 1, the first and second region 14, 16 are magnetized to have a positive polarity, as illustrated by upward pointing arrows. The first region 14 and the second region 16 may be referred to hereinafter as "the first magnetoelastic region 14" and "the second magnetoelastic region 16", respectively.

Also shown in FIG. 1, the shaft 12 may include a third region 18 disposed between the first and second magnetoelastic regions 14, 16. The third region may be configured to generate a substantially negligible magnetic field in response to the applied torque 34. In other words, the magnetic field generated by the third region 18 may be minimal when compared to the magnetic field generated by the first and second magnetoelastic regions 14, 16 and/or may be treated as negligible when determining the applied torque 34. As shown, the third region 18 may be disposed between the first and second magnetoelastic regions 14, 16. As such, the third region 18 may carry a negligible magnetic polarization and may be illustrated in FIG. 1 using a null symbol (Ø). The third region may be referred to hereinafter as "the null-magnetized region 18".

Because the shaft 12 of the torque sensor 10 includes two magnetoelastic regions 14, 16, the torque sensor 10 may be referred to herein as a "dual-band" torque sensor 10. For convenience, the torque sensor 10 will be referred to herein as "the torque sensor 10", but as "the dual-band torque sensor 10" when the torque sensor 10 is being compared to other torque sensors, such as a "tri-band" torque sensor.

Figure 2:
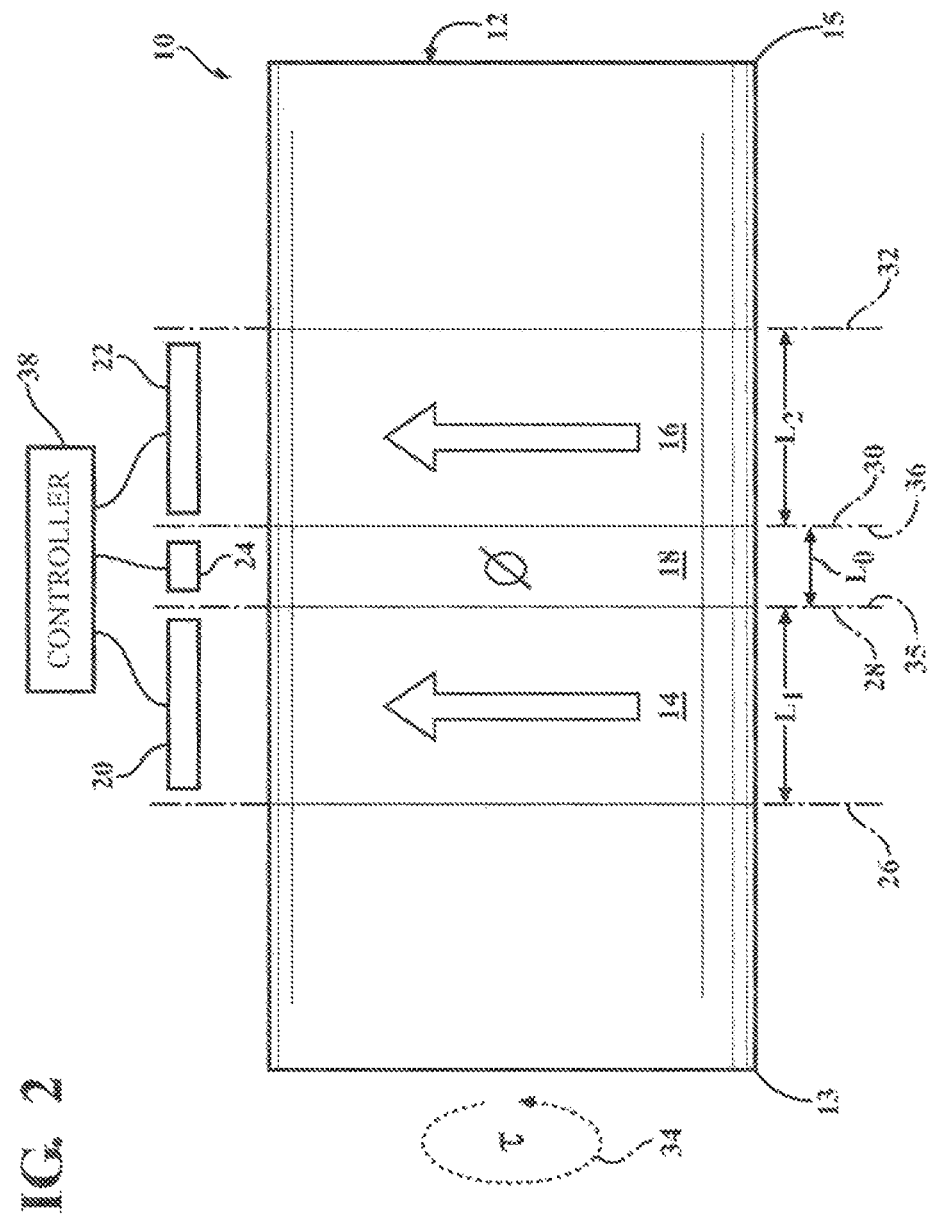
FIG. 2 provides a diagrammatic view of the dual-band torque sensor.

FIG. 2 illustrates another view of the torque sensor 10, wherein relevant lengths and relevant points along the shaft 12 are labeled. As shown in FIG. 2, the first magnetoelastic region 14 may be bound by a first end 26 and a second end 28. The second magnetoelastic region 16 may be bound by a first end 30 and a second end 32. The null-magnetized region 18 may be bound by a first end 35 and a second end 36, where the first end 35 of the null-magnetized region 18 contacts the second end 28 of the first magnetoelastic region 14 and the second end 36 of the null-magnetized region 18 contacts the first end 30 of the second magnetoelastic region 16. It is to be appreciated that the ends of the regions may be seamlessly integrated into the shaft 12 by virtue of magnetization, and without demarcation as shown in FIG. 2. Furthermore, FIG. 2 notes a length of each region 14, 16, 18. Specifically, $L_1$ represents a length of the first magnetoelastic region 14, $L_2$ represents a length of the second magnetoelastic region 16, and $L_0$ represents a length of the null-magnetized region 18.

Figure 3:
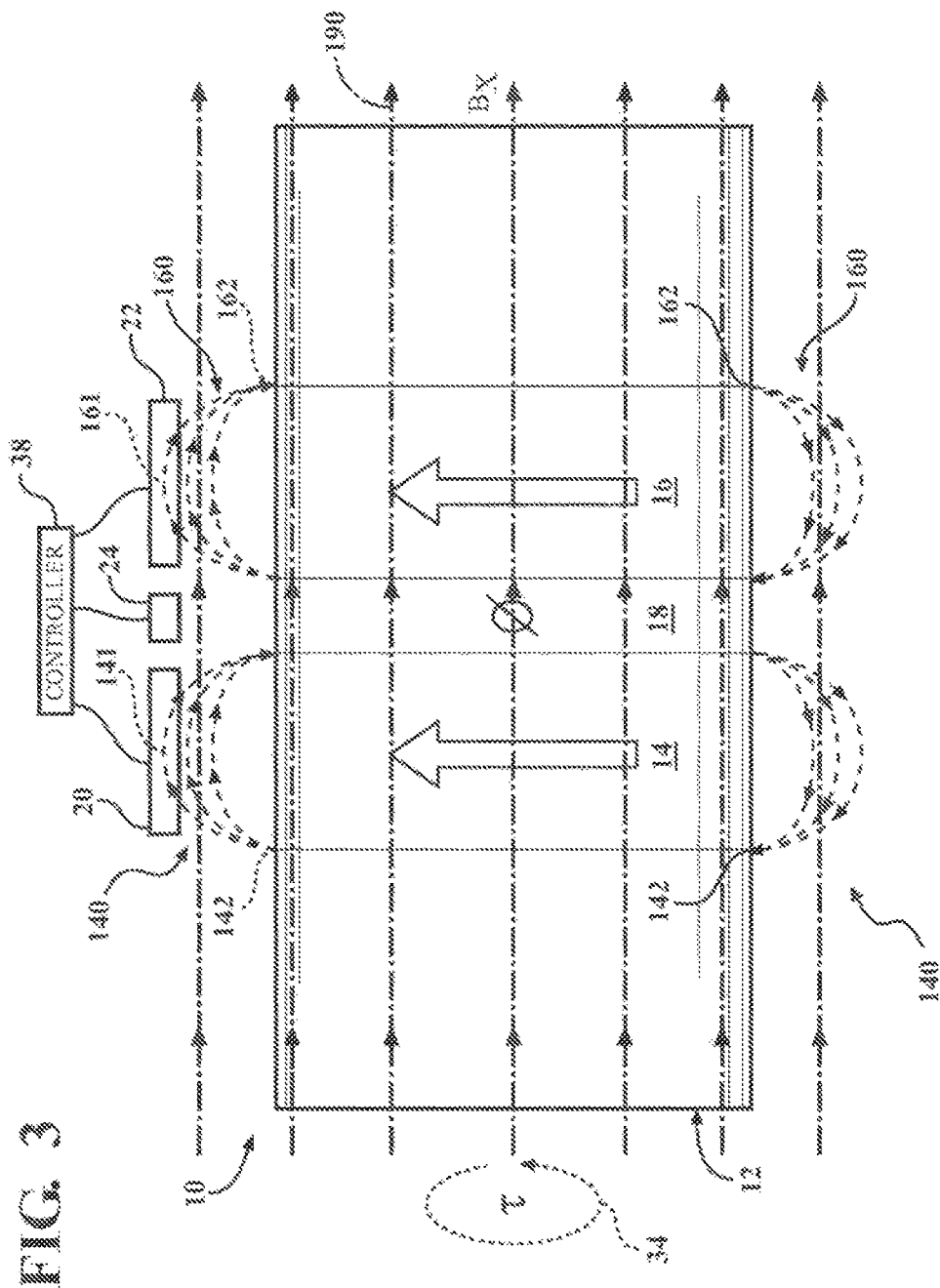
FIG. 3 provides a diagrammatic view of the dual-band torque sensor with a first ambient magnetic field superimposed.

FIG. 3 illustrates yet another view of the torque sensor 10, wherein magnetic fields generated by the first magnetoelastic region 14 and the second magnetoelastic region 16 are shown. As shown in FIG. 3, the first magnetoelastic region 14 may generate a first magnetic field 140, which may be composed of an axial magnetic field component 141 and a radial magnetic field component 142. Similarly, the second magnetoelastic region 16 may generate a second magnetic field 160, which may be composed of an axial magnetic field component 161 and a radial magnetic field component 162. When the applied torque 34 is applied to the shaft 12, the applied torque 34 may alter a magnitude of the axial and radial components of the magnetic field in proportion to the magnitude of the applied torque. Furthermore, unlike the first and second magnetoelastic regions 14, 16, the null-magnetized region 18 does not generate a magnetic field. This quality of the null-magnetized region 18 may be a manufactured, designed, or intrinsic quality.

In one embodiment, the first and second magnetoelastic region 14, 16 may be substantially equivalent in length and may generate substantially equivalent magnetic fields. Specifically stated, in such an embodiment, $L_1$ may be substantially equivalent to $L_2$; the first and second magnetoelastic regions 14, 16 have substantially equivalent magnetic polarities; and the first and second magnetic fields 140, 160 are substantially equivalent in direction and magnitude.

However, it should be noted that, in other embodiments, the first and second magnetoelastic regions 14, 16 may vary in length and may generate unequal magnetic fields. Furthermore, while the first and second magnetoelastic regions 14, 16 have a positive polarity in FIG. 1, the first and second magnetoelastic regions 14, 16 may have a negative polarity.

Referring back to FIG. 1, the torque sensor 10 may also include sensors 20, 22, 24 disposed in relation to regions 14, 16, 18, respectively. Specifically, a first sensor 20 may be disposed adjacent to the first magnetoelastic region 14. Similarly, a second sensor 22 may be disposed adjacent to the second magnetoelastic region 16. A third sensor 24 may be disposed adjacent to the null-magnetized region 18. Furthermore, it should be noted that the sensors 20, 22, 24 may be disposed adjacent to the regions 14, 16, 18 and need not be directly connected to the shaft 12. For example, in one embodiment, the sensors 20, 22, 24 may be disposed in a housing that may be adjacent to, but spaced from, the shaft 12. As such, the sensors 20, 22, 24 and the housing do not influence the applied torque 34 through friction.

Referring to FIG. 3, the first sensor 20 may be configured to sense the first magnetic field 140 generated by the first magnetoelastic region 14 and the second sensor 22 may be configured to sense the second magnetic field 160 generated by the second magnetoelastic region 16. As shown, the first sensor 20 may be configured to sense the magnitude of the axial magnetic field component 141 of the first magnetic field 140. Similarly, the second sensor 22 may be configured to sense the magnitude of the axial magnetic field component 161 of the second magnetic field 160. It should be noted that, in other embodiments, the first sensor 20 may be configured to sense the magnitude of the radial component 142 of the first magnetic field 140 or the axial and radial components 141, 142 of the first magnetic field 140. Likewise, the second sensor 22 may be configured to sense the magnitude of the radial component 162 of the second magnetic field 160 or the axial and radial components 161, 162 of the second magnetic field 160. As such, the first sensor 20 may be configured to produce a reading of the first magnetic field 140 and the second sensor 22 may be configured to produce a reading of the second magnetic field 160.

Also shown in FIG. 3, the first and second sensors 20, 22, as well as the third sensor 24 may be configured to sense a magnitude of an ambient magnetic field, the ambient magnetic field 190 illustrated using multiple dot-dashed lines and labeled $B_x$. By definition, the ambient magnetic field 190 may be a magnetic field generated by sources external to the torque sensor 10, such that the applied torque 34 has a minimal effect on the ambient magnetic field. For example, in an embodiment where the torque sensor 10 may be utilized by an electric power steering unit, the ambient magnetic field 190 may be a magnetic field generated by components of the electric power steering unit not including the torque sensor 10. Referring to embodiment of FIG. 3, the third sensor 24 may be configured to sense the magnitude of the ambient magnetic field 190 and may be configured to produce a reading of the ambient magnetic field. Similarly, the first and second sensors 20, 22 may be configured to sense the magnitude of the ambient magnetic field 190 in addition to the first and second magnetic fields 140, 160, respectively. As such, the first and second sensors 20, 22 may be configured to produce a reading of the ambient magnetic field 190 in addition to a reading of the first and second magnetic fields 140, 160, respectively.

Furthermore, it should be noted that the first sensor 20 may include more than one sensor for sensing the first magnetic field 140 and the ambient magnetic field 190. For example, in one embodiment, the first sensor 20 may include a plurality of sensors, which are adjacent to the first magnetoelastic region 14 and are configured to sense the first magnetic field 140. In such an embodiment, the plurality of sensors may produce the reading of the first magnetic field 140 and the ambient magnetic field 190 by averaging readings produced by each sensor of the plurality of sensors. Likewise, the second sensor 22 may include a plurality of sensors for sensing and producing the reading of the second magnetic field 160 and the ambient magnetic field 190. The third sensor 24 may also include a plurality of sensors for sensing and producing the reading of the ambient magnetic field 190.

It should also be noted that the sensors 20, 22, 24 may be any sensor suitable for sensing a magnetic field. For example, the sensors 20, 22, 24 may include at least one of a Hall effect sensor, a giant magnetoresistance magnetometer, an AMR magnetometer, a magneto-optical sensor, a search coil magnetic field sensor, a magnetodiode, a fluxgate magnetometer, or any other sensor suitable for sensing a magnetic field.

As shown in FIG. 1, the sensors 20, 22, 24 may be coupled to a controller 38, which may be configured to determine the magnitude of the applied torque 34 based on the previously described readings produced by the sensors 20, 22, 24. In some embodiments, the controller 38 and the torque sensor 10 may be components of a vehicular subsystem for determining the magnitude of the applied torque 34. In one such embodiment, the vehicular subsystem may be an electric power steering unit of a vehicle. In such an embodiment, the controller 38 of the electric power steering unit may receive the reading of the first magnetic field 140, the reading of the second magnetic field 160, and the reading of the ambient magnetic field. The controller 38 may then determine the magnitude of the applied torque 34 based on the readings produced by the sensors 20, 22, 24. Furthermore, it should be noted that the controller 38 may comprise any suitable logic, signal processing means, or components for enabling performance of the described functions. Additionally, it should be noted that, in other embodiments, the sensors 20, 22 may be similarly configured to measure other forces applied to the shaft 12, such as stress and strain, and the controller 38 may be configured to determine a magnitude of such other forces.

Advantageously, due to above-described features of the torque sensor 10, the torque sensor 10 may be more compact, allowing the torque sensor 10 to be more immune to ambient magnetic field noise. In this way, the torque sensor 10 may reduce production costs, may fit smaller assemblies, and produce more accurate determinations of the magnitude of the applied torque 34.

II. A Method of Determining the Magnitude of the Applied Torque

Figure 4:
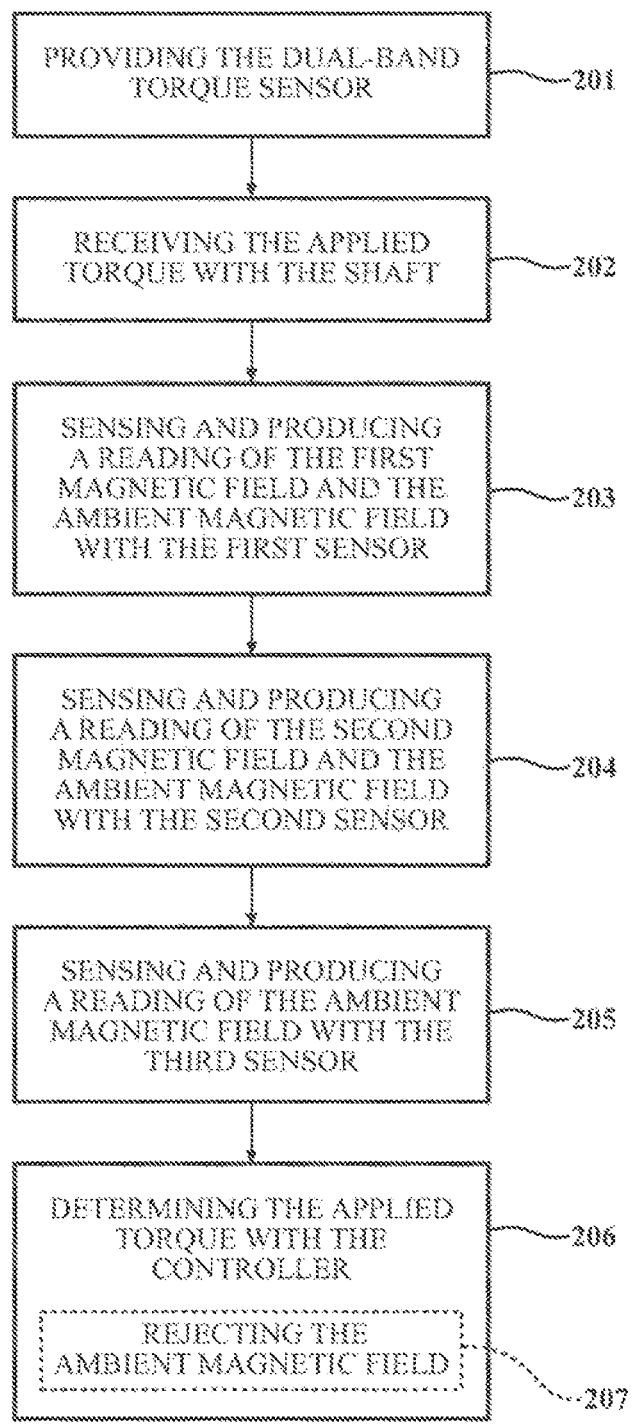
FIG. 4 provides a method of determining a magnitude of an applied torque.

FIG. 4 demonstrates one embodiment of a method of determining the magnitude of the applied torque. The method includes a step 201 of providing the torque sensor 10; a step 202 of receiving the applied torque 34 with the shaft 12 of the torque sensor 10; a step 203 of sensing and producing a reading of the first magnetic field 140 and the ambient magnetic field 190 with the first sensor 20 of the torque sensor 10; a step 204 of sensing and producing a reading of the second magnetic field 160 and the ambient magnetic field 190 with the second sensor 22 of the torque sensor 10; a step 205 of sensing and producing a reading of the ambient magnetic field 190 with the third sensor 24 of the torque sensor 10; and a step 206 of determining the magnitude of the applied torque 34 with the controller 38 based on the readings of the first magnetic field 140, the second magnetic field 160, and the ambient magnetic field 190. As shown in FIG. 4, step 206 may include a step 207 of rejecting the ambient magnetic field 190.

To determine the magnitude of the applied torque 34 during step 206, a system of equations may be defined for the readings produced by the sensors 20, 22, 24. For example, the system of equations may express the readings produced by the sensors 20, 22, 24 (represented by $S_1$, $S_2$, and $S_3$) in terms of a magnitude of an axial component of a magnetic field proportional to the applied torque 34 ($\tau_x$), a magnitude of an axial component of the ambient magnetic field 190 ($B_x$), and a magnitude of a first-order spatial derivative of the ambient magnetic field 190 ($\delta_x$). In the system of equations, the magnitude of the axial component of the magnetic field proportional to the applied torque 34 corresponds to the magnitude of the applied torque 34, which is being solved for in step 206. Furthermore, the magnitude of the axial component of the ambient magnetic field 190 ($B_x$) and the magnitude of the first-order spatial derivative of the ambient magnetic field 190 ($\delta_x$), in combination, approximate an effect of the ambient magnetic field 190 on the readings produced by the sensor 20, 22, 24. In embodiments where there is little variation from the ambient magnetic field 190, such as the embodiment of FIG. 3, this approximation leads to minimal error when calculating the magnitude of the applied torque 34, because there is little noise from the ambient magnetic field 190. The system of equations may be defined as follows:

$$\begin{cases} S_1 = \tau_x + B_x + \delta_x, \\ S_2 = \tau_x + B_x - \delta_x, \\ S_3 = B_x \end{cases}$$

It should be noted that, while the sensors 20, 22, 24 may be configured to sense a magnitude of a radial component of a magnetic field, the sensors 20, 22, 24 in the above system of equations are configured to sense a magnitude of an axial component of a magnetic field. Furthermore, it may be assumed that the first and second magnetic fields 140, 160 generated by the first and second magnetoelastic regions 14, 16 are substantially equivalent magnetic fields, the magnitude of the axial component of the first and second magnetic fields 140, 160 are substantially equivalent to the magnitude of the axial component of the magnetic field proportional to the applied torque 34 ($\tau_x$). Additionally, it may be assumed that the torque sensor 10 may be placed on a coordinate plane with an origin at the exact center of the non-magnetic region 18 and that the two outer regions 14, 16 are of identical length.

In the above-defined system of equations, it may be assumed that sensors 20, 22, 24 are adjacent to the regions 14, 16, 18 and, therefore, that the readings produced by the sensors 20, 22, 24 may be expressed using the properties of the regions 14, 16, 18. For example, the first sensor 20 may be disposed adjacent to the first magnetoelastic region 14. As such, the reading produced by the first sensor 20 ($S_1$) may be represented as a sum of the magnetic field proportional to the applied torque 34 ($\tau_x$), the ambient magnetic field 190 ($B_x$), and the first-order spatial derivative of the ambient magnetic field 190 ($\delta_x$). Similarly, the second sensor 22 may be disposed adjacent to the second magnetoelastic region 16. Additionally, the second sensor 22 may be located on an opposite side of the coordinate plane from the first sensor 20.

As such, the reading produced by the second sensor 22 ($S_2$) may include the magnetic field proportional to the applied torque 34 ($\tau_x$) and the ambient magnetic field 190 ($B_x$), as well as a reversal of the first-order spatial derivative ($\delta_x$). The third sensor 24 may be disposed adjacent to the null-magnetized region 18 with the origin of the coordinate plane at an exact center of the null-magnetized region 18. Therefore, the reading produced by the third sensor 24 ($S_3$) includes the ambient magnetic field 190 ($B_x$).

Using the system of equations above, one may solve for $\tau_x$ and determine the magnitude of the axial component of the magnetic field proportional to the applied torque 34 ($\tau_x$). For example, using the system of equations above, one could express $\tau_x$ in the following way:

$$\tau_x = \frac{S_1 - 2S_3 + S_2}{2}$$

Therefore, after the controller 38 receives the readings produced by the sensors 20, 22, 24 ($S_1$, $S_2$, and $S_3$), the controller 38 may determine the magnitude of the axial component of the magnetic field proportional to the applied torque 34 ($\tau_x$). Because $\tau_x$ may be proportional to the applied torque 34, once $\tau_x$ is determined, the controller 38 may determine the magnitude of the applied torque 34.

As previously stated, step 206 of determining the magnitude of the applied torque 34 with the controller 38 may include step 207, the step of rejecting the ambient magnetic field 190. Referring to the expression of $\tau_x$ above, it should be noted that, by adding $S_1$ and $S_2$ and subtracting $2*S_3$, the ambient magnetic field 190 ($B_x$) may be effectively rejected from the expression of $\tau_x$. Otherwise stated, the magnitude of the ambient magnetic field 190 ($B_x$) does not affect the determination of $\tau_x$ and, subsequently, the determination of the magnitude of the applied torque 34.

It should be noted that, in other embodiments of the method, steps 201-206 may be ordered in any suitable fashion. For example, in some embodiments, steps 203, 204, and 205 may occur in any suitable order and may occur simultaneously. Furthermore, some steps of the method may occur continuously. For example, the applied torque 34 may be received by the shaft 12 while steps 203, 204, and 205 occur. In another example, steps 203, 204, 205, and 206 may occur continuously such that the sensors 20, 22, 24 may continuously produce readings and the controller 38 may continuously determine the magnitude of the applied torque 34.

III. The Compact Nature of the Dual-Band Torque Sensor

Figure 6:
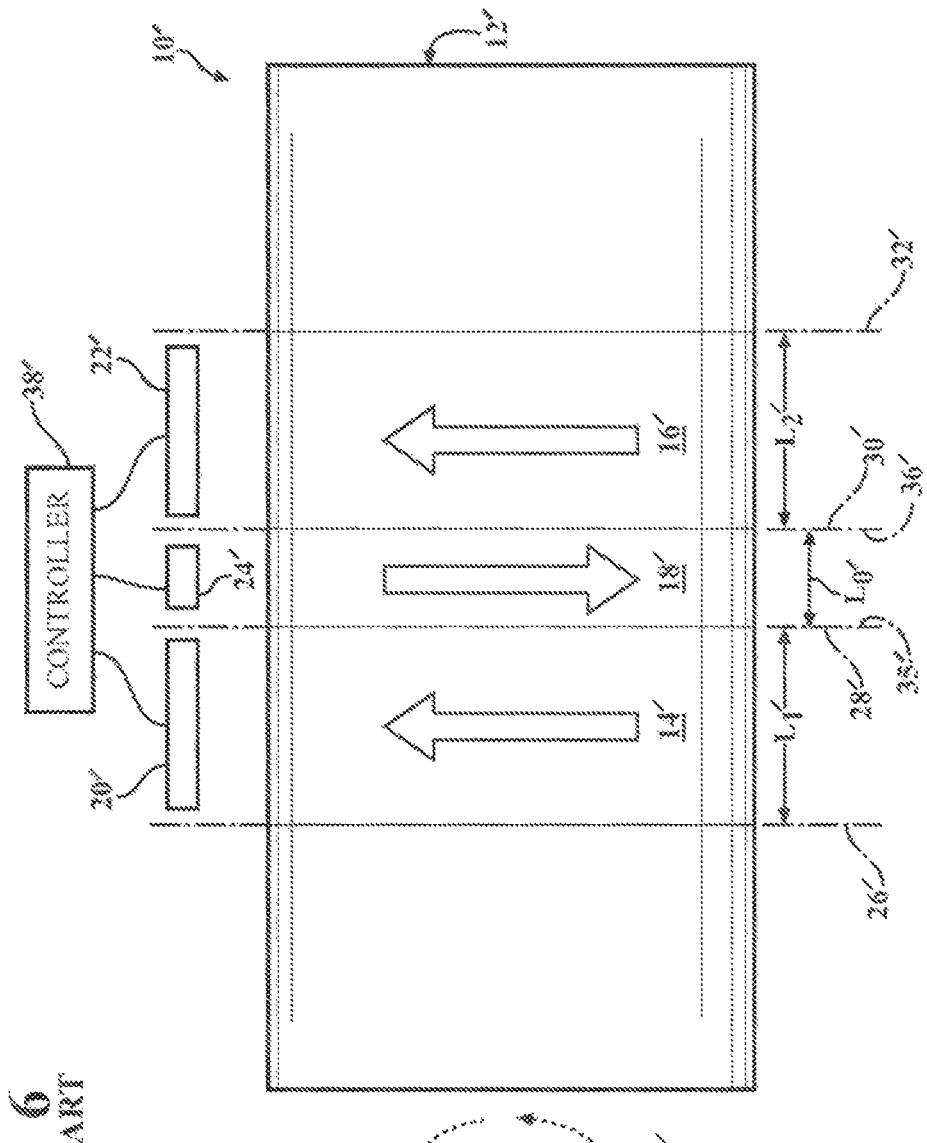
FIG. 6 provides a diagrammatic view of a tri-band torque sensor.

As previously stated, the above-described features of the torque sensor 10 allow the torque sensor 10 to be more compact. To aid in explaining the compact nature of the torque sensor 10, FIG. 6 illustrates a torque sensor 10' for comparison. It should be noted that torque sensor 10' is discussed herein to further demonstrate features and advantages of the dual-band torque sensor 10. Furthermore, it should be understood that the torque sensor 10' is distinct and independent from the torque sensor 10.

As shown in FIG. 6, the torque sensor 10' includes three magnetoelastic regions 14', 16', 18' and may be referred to herein as a tri-band torque sensor 10' (recall that torque sensor 10 may be referred to as the dual-band torque sensor 10). As shown, the first magnetoelastic region 14' and the second magnetoelastic region 16' are of substantially equivalent magnetic polarity. In contrast to the dual-band torque sensor 10, the tri-band torque sensor 10' comprises a third magnetoelastic region 18', of opposite magnetic polarity to the first magnetoelastic region 14' and the second magnetoelastic region 16'. The tri-band torque sensor 10' also includes the sensors 20', 22', 24' to sense the magnetic fields produced by the magnetoelastic regions 14', 16', 18' in response to the applied torque 34'.

In comparison to the tri-band torque sensor 10', the dual-band torque sensor 10 shown in FIG. 1 may be more compact without compromising signal quality. The dual-band torque sensor 10 may accomplish this by taking advantage of the null-magnetized region 18 and its placement relative the first magnetoelastic region 14 and the second magnetoelastic region 16.

Figure 7A:
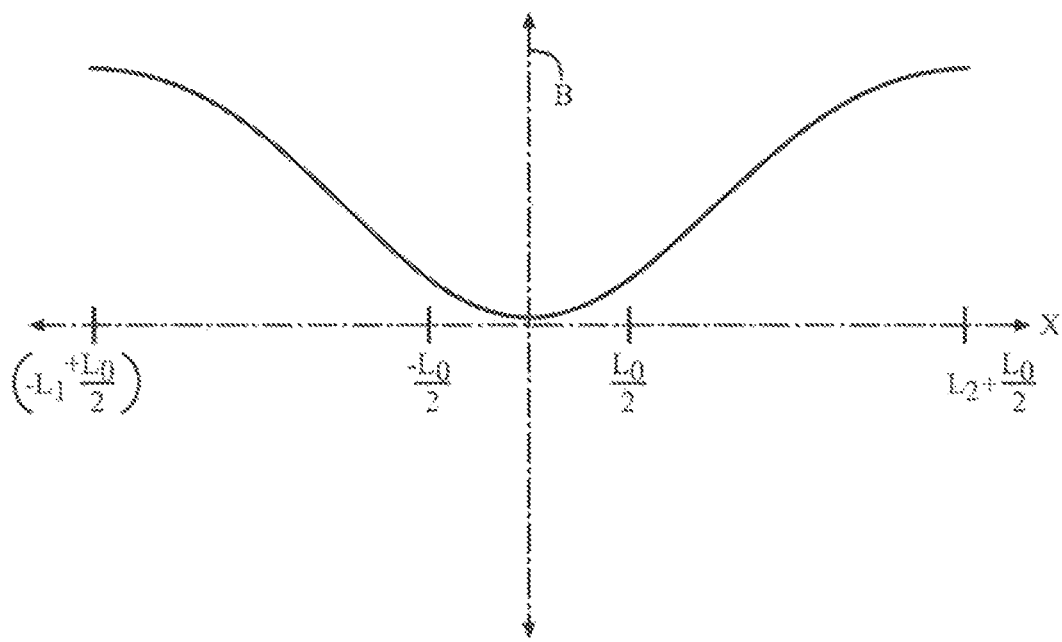
FIGS. 7a and 7b provide graphs of a magnetic field strength generated by the dual-band torque sensor and a magnetic field strength generated by the tri-band torque sensor, with respect to distance along each torque sensor.
Figure 7B:
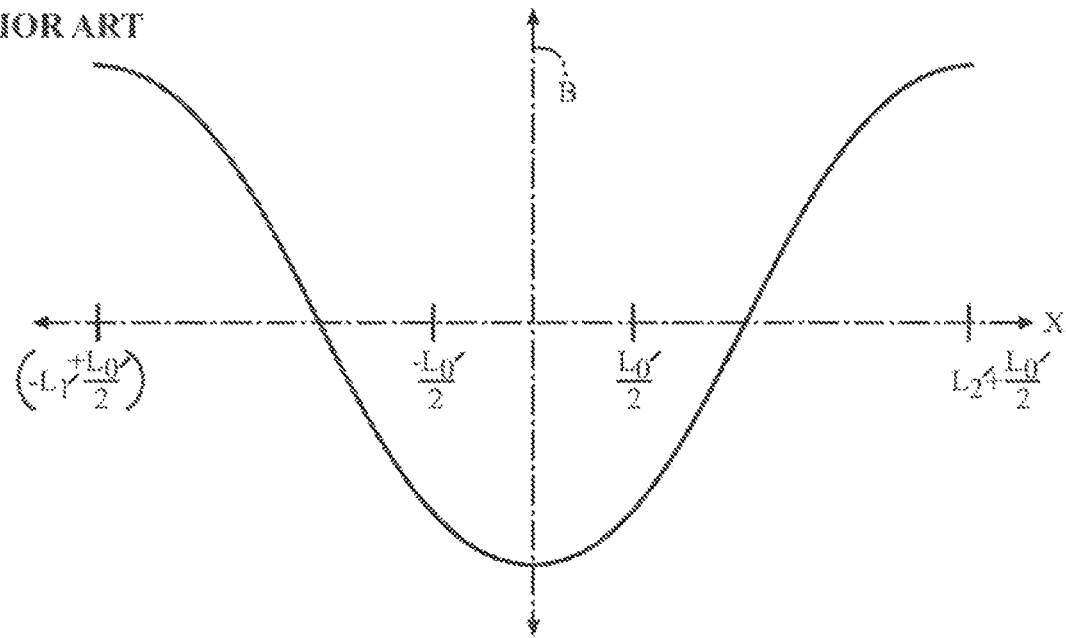

FIG. 7a provides a graph of a magnetic field strength (B) of the dual-band torque sensor 10, with respect to a distance along the dual-band torque sensor 10 ($x$). In comparison, FIG. 7b shows a magnetic field strength (B) of the tri-band torque sensor 10', with respect to a distance along the tri-band torque sensor 10' ($x$). As shown, the distance along the torque sensors 10, 10' is in reference to the relevant lengths labeled in FIG. 2 and FIG. 6, respectively. Furthermore, in FIGS. 7a and 7b, the torque sensors 10, 10' are placed on coordinate planes such that an exact center of the null-magnetized region 18 and the third magnetoelastic region 18' coincides with an origin of the coordinate planes.

Figure 8:
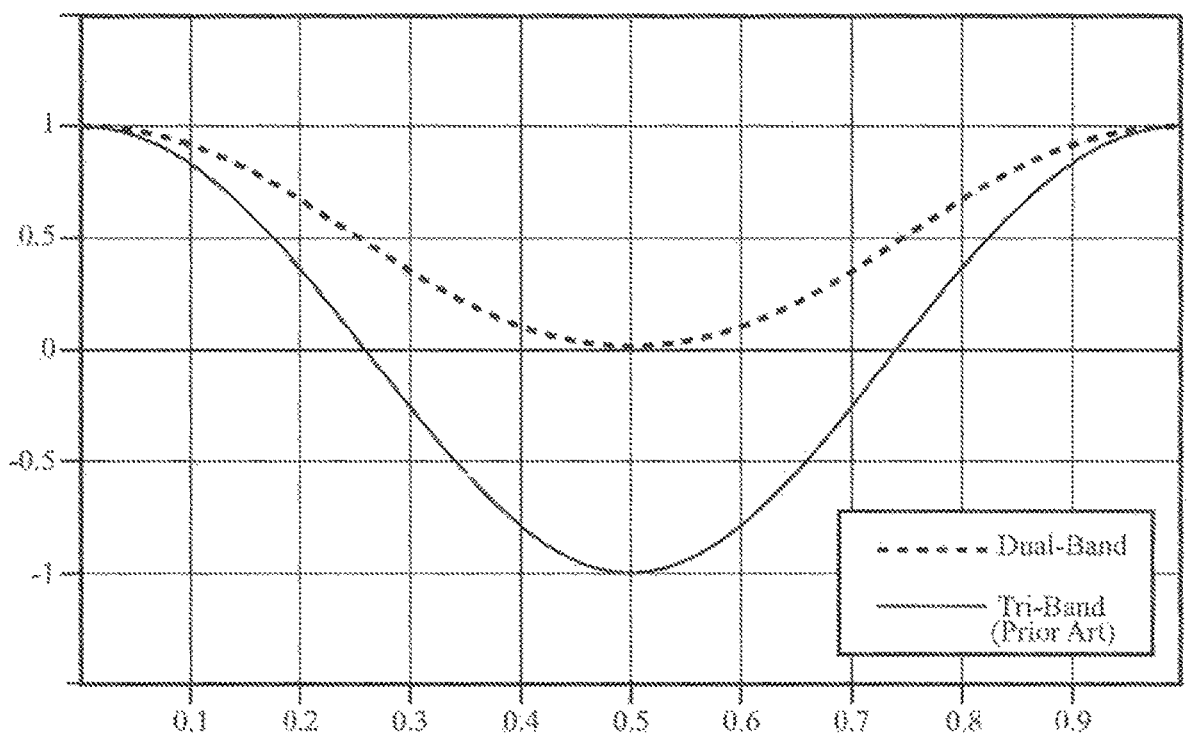
FIG. 8 provides a graph wherein the magnetic field strengths shown in FIG. 7a and FIG. 7b are superimposed.

FIG. 8 provides a graph superimposing the magnetic field strengths shown in FIGS. 7a and 7b, respectively. It is to be appreciated that, by superimposing the magnetic field strengths shown in FIGS. 7a and 7b, FIG. 8 assumes that the first end 26 of the first magnetoelastic region 14 of the dual-band torque sensor 10 matches up with the first end 26' of the first magnetoelastic region 14' of the tri-band torque sensor 10', that the first end 35 of the null-magnetized region 18 of dual-band torque sensor 10 matches up with the first end 35' of the third magnetoelastic region 18' of the tri-band torque sensor 10', that the first end 30 of the second magnetoelastic region 16 of the dual-band torque sensor 10 matches up with the first end 30' of the second magnetoelastic region 16' of the tri-band torque sensor 10', and that the second end 32 of the second magnetoelastic region 16 of the dual-band torque sensor 10 matches up with the second end 32' of the second magnetoelastic region 16' of the tri-band torque sensor 10'. Furthermore, FIG. 8 assumes that the first magnetoelastic region 14 of the dual-band torque sensor 10 and the first magnetoelastic region 14' of the tri-band torque sensor 10' are of substantially equivalent magnetic polarity. Likewise, FIG. 8 assumes the second magnetoelastic region 16 of the dual-band torque sensor 10 and the second magnetoelastic region 16' of the tri-band torque sensor 10' are of substantially equivalent magnetic polarity. Additionally, the applied torques 34, 34' applied to torque sensors 10, 10', respectively, are assumed to be substantially equivalent for comparative purposes and will both be referred to hereafter as "the applied torque 34".

Furthermore, it should be noted that the graph of FIG. 8 assumes that the sensors 20', 22', 24' are placed in the same positions as sensors 20, 22, 24. As such, sensors 20, 22, 24, 20', 22', 24' are placed such that the sensors 20, 22, 24, 20', 22', 24' sense a maximum magnitude of the magnetic field of the dual-band torque sensor 10 or the tri-band torque sensor 10' at critical points (peaks and valleys) of the magnetic field strength. This is because the maximum magnitudes of the magnetic fields at the critical points are proportional to the applied torque 34. However, in some embodiments, the sensors 20, 22, 24, 20', 22', 24' sense not only the maximum magnitude of the magnetic field at the critical points, but also a magnitude of the magnetic field at locations adjacent to the critical points. In such embodiments, it may be said that sensors 20, 22, 24, 20', 22', 24' sense an axial position noise at locations adjacent to the critical points. Additionally, it may be said that sensors 20, 22, 24, 20', 22', 24' sense minimal axial position noise at the critical points. This phenomena may be quantified using a displacement tolerance of a torque sensor.

The displacement tolerance of a torque sensor may be defined as a ratio between a displacement of magnetic field sensors within the torque sensor and the corresponding axial position noise received. For example, referring to FIG. 8, the displacement tolerance of the torque sensors 10, 10' may be readily noted. To reiterate, the sensors 20, 22, 24, 20', 22', 24' are placed to sense a maximum magnitude of the magnetic field of the dual-band torque sensor 10 or the tri-band torque sensor 10' at critical points (peaks and valleys) of the magnetic field strength. In the embodiment of FIG. 8, this occurs at x=0 mm, 5 mm, and 10 mm, assuming the torque sensors 10, 10' have an equal length of 10 mm. Accordingly, by comparing the magnetic field strength for the dual-band torque sensor 10 at x=0 mm and x=1 mm, a displacement of 1 mm causes approximately 10% signal loss. Similarly, for the tri-band torqne sensor 10', a displacement of 1 mm causes approximately 20% signal loss. As such, displacement tolerance (DT in the equation below) for the torque sensors 10, 10' may be calculated as follows:

$$DT_{dual\text{-}band} = \frac{1 \text{ mm}}{10\% \text{ signal loss}} = 0.1 \frac{\text{mm}}{\% \text{ signal loss}}$$

$$DT_{tri\text{-}band} = \frac{1 \text{ mm}}{20\% \text{ signal loss}} = 0.05 \frac{\text{mm}}{\% \text{ signal loss}}$$

As such, based on the displacement tolerance values for the torque sensors 10, 10', the dual-band torque sensor 10 is less sensitive to displacement errors of its sensors 20, 22, 24 than the tri-band torque sensor 10' is to displacement errors of its sensors 20', 22', 24'. Said differently, the dual-band torque sensor 10 has a higher displacement tolerance than the tri-band torque sensor 10'.

The dual-band torque sensor 10 has a higher displacement tolerance than the tri-band torque sensor 10' because the tri-band torque sensor 10' includes the third magnetoelastic region 18', while the dual-band torque sensor 10 includes the null-magnetized region 18. Referring to FIG. 8, the magnetic field strength sensed by the sensors 20', 22', 24' of the tri-band torque sensor 10' begins at the same value (in FIG. 8) as the magnetic field strength sensed by the sensors 20, 22, 24 of the dual-band torque sensor 10. This is because the first magnetoelastic regions 14, 14' are of substantially equivalent magnetic polarity. Similarly, the strengths of both magnetic fields end at the same value (in FIG. 8) because the second magnetoelastic regions 16, 16' are of substantially equivalent magnetic polarity. However, because the third magnetoelastic region 18' of the tri-band torque sensor 10' may be of negative magnetic polarity and the null-magnetized region 18 of the dual-band torque sensor 10 has no magnetic polarity, the magnetic field strength sensed by the tri-band torque sensor 10' reaches a negative value in FIG. 8.

As shown in FIG. 8, the magnetic field strength of the tri-band torque sensor 10' declines more rapidly to reach the negative value. As a result, the critical points of the magnetic field strength of the tri-band torque sensor 10' are much sharper when compared to critical points of the magnetic field strength of the dual-band torque sensor 10, as shown in FIG. 8. Therefore, the magnetic field at locations adjacent to the critical point may be much lower in magnitude for the magnetic field of the tri-band torque sensor 10'. As such, because the magnitude of the magnetic field at locations adjacent to the critical point may be lower for the magnetic field of the tri-band torque sensor 10' than for the magnetic field of the dual-band torque sensor 10, the dual-band torque sensor 10 has a resultantly higher displacement tolerance than the tri-band torque sensor 10'.

However, although the dual-band torque sensor 10 has a higher displacement tolerance than the tri-band torque sensor 10', the displacement tolerance of the tri-band torque sensor 10' may be within a range of acceptability that allows the torque sensor 10' to accurately determine the magnitude of the applied torque 34. Therefore, the dual-band torque sensor 10 may be compressed and still determine the magnitude of the applied torque 34 accurately. This compression may be accomplished by compressing the axial length of the regions 14, 16, 18 of the dual-band torque sensor 10.

In order to ensure that the compressed dual-band torque sensor 10 still determines the applied torque 34 accurately, the critical points of the graph of the magnetic field strength of the dual-band torque sensor 10 may be compressed to match the critical points of the graph of the magnetic field strength of the tri-band torque sensor 10'. As such, the dual-band torque sensor 10 may be compressed by compressing the graph of the magnetic field strength of the dual-band torque sensor 10.

To determine a compression factor by which the regions 14, 16, 18 of the dual-band torque sensor 10 may be compressed, the magnetic field strength of the dual-band torque sensor 10 ($B_{dual}$) and the magnetic field strength of the tri-band torque sensor 10' ($B_{tri}$) may be modeled using a pair of equations. Given the sinusoidal nature of the strengths of the magnetic fields, $B_{dual}$ and $B_{tri}$ may be expressed as follows:

$$B_{dual} = \frac{1 + \cos(2\pi x)}{2},$$
$$B_{tri} = \cos(2\pi x)$$

Furthermore, to determine the compression factor by which the regions 14, 16, 18 of the dual-band torque sensor 10 may be compressed, the compression factor ($\alpha$) may be expressed using $B_{dual}$ and $B_{tri}$:

$$B_{dual}(\alpha) = \frac{1 + \cos(2\pi \alpha x)}{2},$$
$$B_{tri} = \cos(2\pi x)$$

As such, the compression factor ($\alpha$) may be adjusted to adjust $B_{dual}(\alpha)$. In this way, when $\alpha>1$, the critical points of $B_{dual}(\alpha)$ may be compressed and the dual-band torque sensor 10 may also be compressed.

Furthermore, to determine the compression factor by which the regions 14, 16, 18 of the dual-band torque sensor 10 may be compressed, the compression may be considered with regard to an effect the compression has on the displacement tolerance of the dual-band torque sensor 10. As previously stated, although the dual-band torque sensor 10 has a higher displacement tolerance than the tri-band torque sensor 10', the displacement tolerance of the tri-band torque sensor 10' may be within a range of acceptability that allows the torque sensor 10' to accurately determine the magnitude of the applied torque 34. As such, to ensure that the displacement tolerance of the dual-band torque sensor 10 is also within a range of acceptability, the displacement tolerance of the dual-band torque sensor 10 may be set to be equal to the displacement tolerance of the tri-band torque sensor 10'. To accomplish this, the axial position noise sensed by the sensors 20, 22, 24 and the axial position noise sensed by the sensors 20', 22', 24' may both be represented using λ. Assuming a normalized magnetic field strength, λ may be expressed accordingly:

$$1 - \lambda = \frac{1 + \cos(2\pi \alpha x)}{2},$$
$$1 - \lambda = \cos(2\pi x)$$

Therefore, to consider the effect the compression has on the axial position noise sensed by sensors 20, 22, 24, the compression factor ($\alpha$) may be expressed in terms of λ accordingly:

$$\kappa = \frac{\cos^{-1}(1 - 2\lambda)}{\cos^{-1}(1 - \lambda)}$$

Using the above equation, the value of $\alpha$ when the axial position noise (λ) sensed by the sensors 20, 22, 24 is minimized may be determined by setting λ as equal to 0. By taking the limit of $\alpha$ as $\lambda \rightarrow 0$, we obtain a value of $\alpha$, or compression factor, equal to $\sqrt{2}$.

Figure 9:
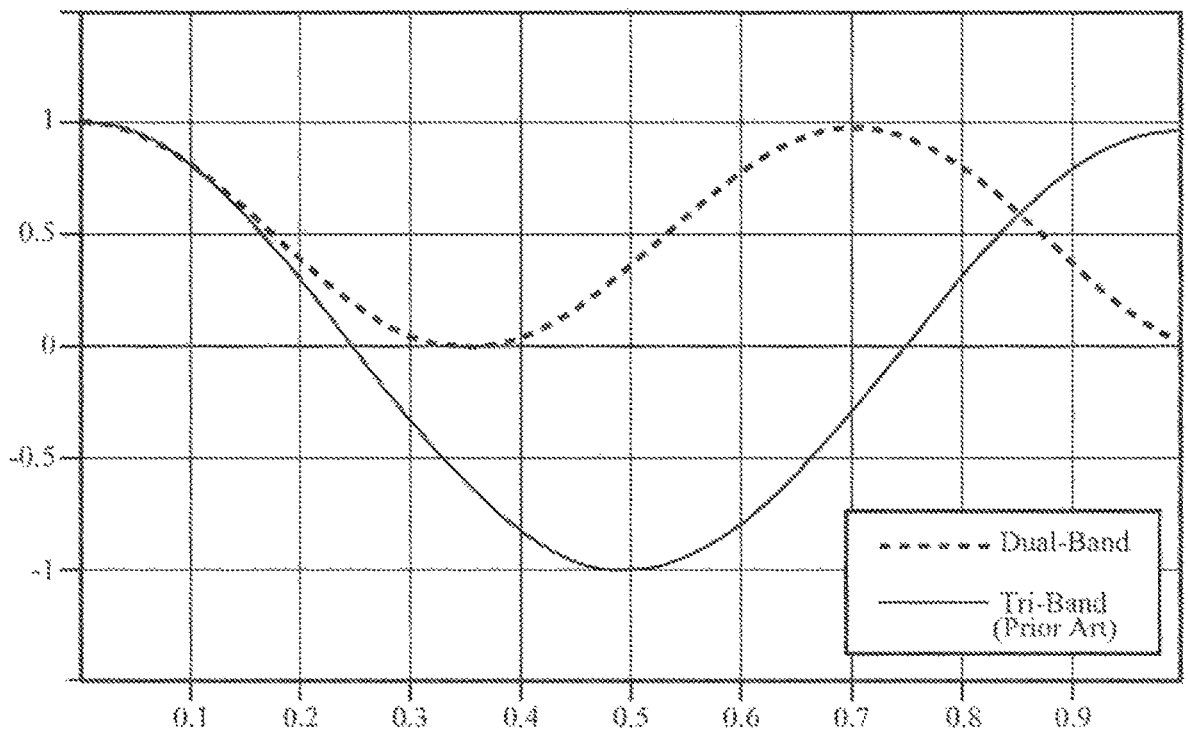
FIG. 9 provides a graph wherein a magnetic field strength of a compressed dual-band torque sensor and the magnetic field of the tri-band torque sensor are superimposed.

FIG. 9 provides a graph illustrating the magnetic field strength of the tri-band torque sensor 10' and the magnetic field strength of the dual-band torque sensor 10 after the regions 14, 16, 18 have been compressed by a factor of $\sqrt{2}$. As shown, the critical points of the graph of the magnetic field strength of the dual-band torque sensor 10 have been compressed to match the critical points of the graph of the tri-band torque sensor 10'. As a result, the compression of the regions 14, 16, 18 of the dual-band torque sensor 10 allows the dual-band torque sensor 10 to more compactly determine the magnitude of the applied torque 34, while maintaining an acceptable displacement tolerance. As such, the dual-band torque sensor is able to acceptably reject axial position noise due to displacement error from the sensors 20, 22, 24 and accurately determine the magnitude of the applied torque 34.

It should be noted that the dual-band torque sensor 10 may be compressed in a variety of ways. The dual-band torque sensor 10 may be compressed in any suitable manner such that the displacement tolerance of the dual-band torque sensor 10 is within a range of acceptability and the dual-band torque sensor 10 may accurately determine the magnitude of the applied torque 34. For example, in some embodiments, the first and second magnetoelastic regions 14, 16 may be compressed. In other embodiments, the non-magnetic region 18 may be compressed. In still other embodiments, the regions 14, 16, 18 may be compressed.

IV. Increased Immunity to Ambient Magnetic Field Noise

As previously stated, tire dual-band torque sensor 10 may be more compact, allowing the dual-band torque sensor 10 to be more immune to ambient magnetic field noise. As discussed in Section II, the dual-band torque sensor 10 may reject the ambient magnetic field 190 to determine the magnitude of the applied torque 34. In this section, Section IV, an immunity of the dual-band torque sensor to noise from the ambient magnetic field 190 is discussed and compared with an immunity of the previously-described tri-band torque sensor 10' to noise from the ambient magnetic field 190.

To compare the immunities of the torque sensors 10, 10' to noise from the ambient magnetic field 190, the system of equations from Section II may be modified to apply to both the dual-band torque sensor 10 and the tri-band torque sensor 10'. Recall that the system of equations from Section II expresses the readings of the sensors 20, 22, 24 in terms of the magnitude of an axial component of a magnetic field proportional to the applied torque 34 ($\tau_x$), the magnitude of the axial component of the ambient magnetic field 190 ($B_x$), and the magnitude of a first-order spatial derivative of the ambient magnetic field 190 ($\delta_x$). As shown below, the system of equations may be modified to also express the readings of the sensors 20', 22', 24', the sensors of the tri-band torque sensor 10'. The system of equations may be defined as follows, where k=0 for the dual-band torque sensor 10 and k=−1 for the tri-band torque sensor 10':

$$\begin{cases} S_1 = \tau_x + B_x + \delta_x, \\ S_2 = \tau_x + B_x - \delta_x, \\ S_3 = k * \tau_x + B_x + 0. \end{cases}$$

Therefore, using the above system of equations, the magnitude of an axial component of a magnetic field proportional to the applied torque 34 ($\tau_x$) for the dual-band torque sensor 10 and the tri-band torque sensor 10' may be expressed as follows:

$$\text{if } k = 0, \tau_x = \frac{S_1 - 2S_3 + S_2}{2}, \text{ and}$$

$$\text{if } k = -1, \tau_x = \frac{S_1 - 2S_3 + S_2}{4}.$$

The above-defined system of equations assumes that the tri-band torque sensor 10' may be placed on a coordinate plane with an origin at the exact center of the third magnetoelastic region 18' of the tri-band torque sensor 10'. Furthermore, the system of equations assumes that the first magnetoelastic regions 14, 14' and the second magnetoelastic regions 16, 16' of the dual-band torque sensor 10 and the tri-band torque sensor 10' are of substantially equivalent length and that each generates a magnetic field with an axial magnitude equivalent to $\tau_x$. Additionally, the system of equations assumes that the third magnetoelastic region 18' and the non-magnetic region 18 are of substantially equivalent length. However, the system of equations also assumes that the third magnetoelastic region 18' generates a magnetic field with an axial magnitude equivalent to $\tau_x$, but with a negative polarity, while the non-magnetic region 18 does not generate a magnetic field.

Figure 5:
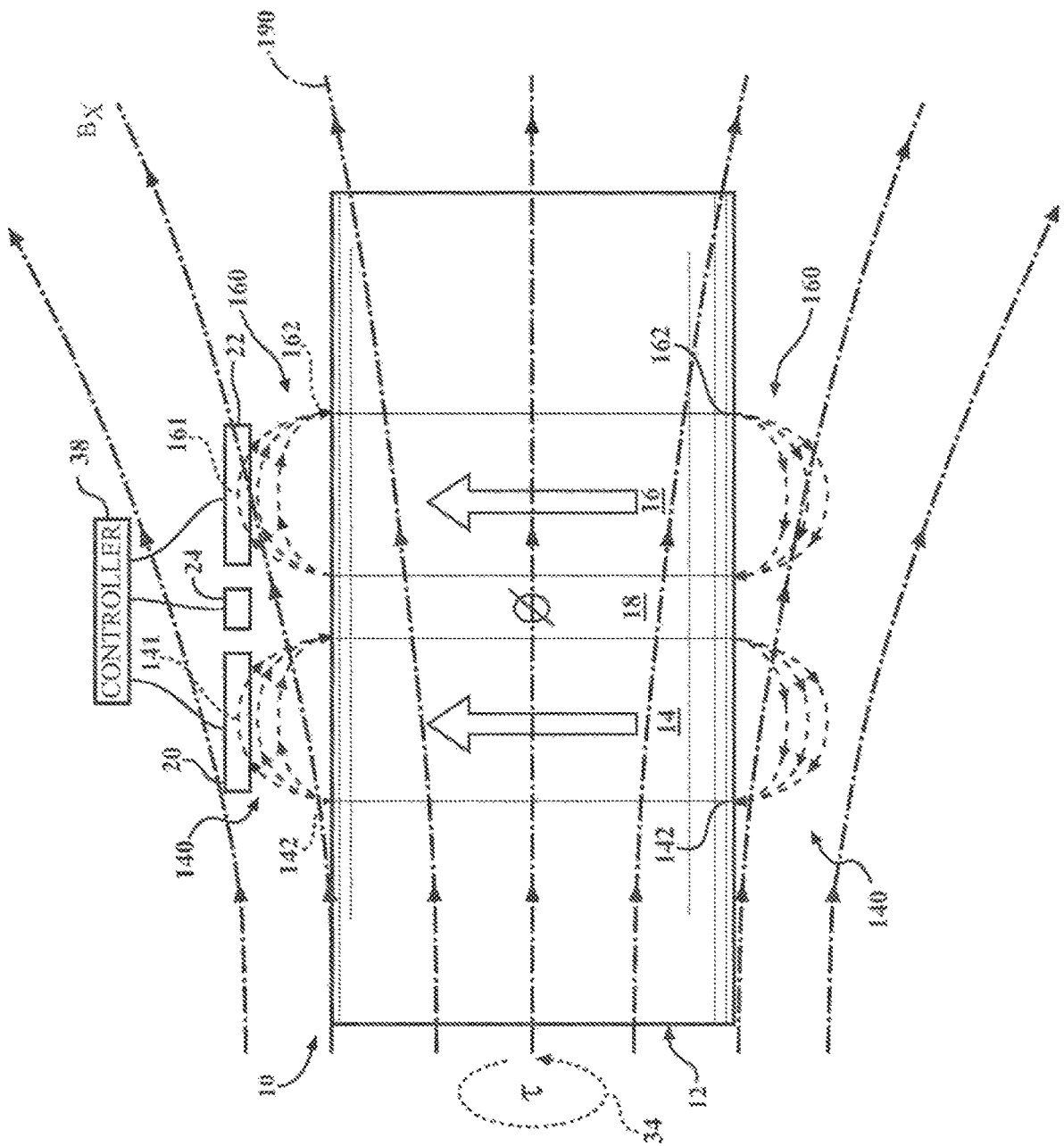
FIG. 5 provides a diagrammatic view of the dual-band torque sensor with a second ambient magnetic field superimposed.

It should be noted that, in the above system of equations, which are used by the dual-band torque sensor 10 and the tri-band torque sensor 10' to calculate the applied torque 34, the magnitude of the axial component of the ambient magnetic field 190 ($B_x$) and the magnitude of the first-order spatial derivative of the ambient magnetic field 190 ($\delta_x$) approximate an effect of the ambient magnetic field 190 on the readings produced by the sensor 20, 22, 24. Also previously stated, in embodiments where there is little variation from the ambient magnetic field 190, such as the embodiment of FIG. 3, this approximation leads to minimal error when calculating the magnitude of the applied torque 34, because there is little noise from the ambient magnetic field 190. However, in embodiments where there is more variation from the ambient magnetic field 190, such as the embodiment of FIG. 5, this approximation leads to more error when calculating the magnitude of the applied torque 34, because there is more noise from the ambient magnetic field 190. As such, the immunity of the dual-band torque sensor 10 to the noise of the ambient magnetic field 190 is compared to the immunity of the tri-band torque sensor 10' to the noise of the ambient magnetic field 190.

To determine the immunities of the torque sensors 10, 10' to the noise of the ambient magnetic field 190, the magnitude of the axial component of the ambient magnetic field 190 ($B_x$) and the magnitude of a first-order spatial derivative of the ambient magnetic field 190 ($\delta_x$) may be replaced with a power series representing the ambient magnetic field 190. The ambient magnetic field 190 (represented as B(x)) may be expanded into a power series centered about the origin of the previously-established coordinate plane where x may be a distance from the origin:

$$B(x) = B_0 + B_1 x + B_2 x^2 + \ldots + B_n x^n + \ldots$$

As follows:

$$B(0) = B_0,$$

$$B(x) = B_0 + B_1 x + B_2 x^2 + \ldots B_n x^n + \ldots, \text{ and}$$

$$B(-x) = B_0 - B_1 x + B_2 x^2 + \ldots - B_{2n-1} x^{2n-1} + B_{2n} x^{2n} + \ldots$$

We may apply this equation for the ambient magnetic field 190 (B(x)) to the above system of equations, $$\begin{cases} S_1 = \tau_x + B(-x), \\ S_2 = k * \tau_x + B_0, \\ S_3 = \tau_x + B(x). \end{cases}$$

Solving for $\tau_x$, we obtain:

$$\text{if } k = 0, \tau_x = \frac{S_1 - 2S_3 + S_2}{2} - \epsilon, \text{ and}$$

$$\text{if } k = -1, \tau_x = \frac{S_1 - 2S_3 + S_2}{4} - \frac{\epsilon}{2},$$

where $\epsilon = (B_2 x^2 + B_4 x^4 \ldots + B_{2n} x^{2n})$.

It may be readily noted that, for both the dual-band torque sensor 10 and the tri-band torque sensor 10', the $\tau_x$ value for an ambient magnetic field 190 may be defined as a sum of the previously solved for $\tau_x$ value and an ambient magnetic field noise ($\epsilon$) from even polynomials of the power series representing the ambient magnetic field 190. Furthermore, comparing the $\tau_x$ values for the dual-band torque sensor 10 and the tri-band torque sensor 10', it may be readily noted that the sensors 20', 22', 24' of the tri-band torque sensor 10' sense half as much noise as the dual-band torque sensor 10.

However, as previously described in Section III, the regions 14, 16, 18 of the dual-band torque sensor 10 may be compressed by a factor of $\sqrt{2}$. Therefore, $x_{dual}$ may be expressed as:

$$x_{dual} = \frac{x_{tri}}{\sqrt{2}}.$$

As follows, the non-uniform ambient magnetic field noise for the dual-band torque sensor 10 and the non-uniform ambient magnetic field noise ($\epsilon_{tri}$) for the tri-band torque sensor 10' may be expressed as:

$$\epsilon_{tri} = \frac{1}{2}(B_2 x_{tri}^2 + B_4 x_{tri}^4 \ldots + B_{2n} x^{2n} + \ldots ), \text{ and}$$

$$\epsilon_{dual} = \frac{1}{2}\left(B_2 x_{tri}^2 + B_4 \frac{x_{tri}^4}{2} \ldots + B_{2n} \frac{x_{tri}^{2n}}{2^{n-1}} + \ldots \right)$$

Therefore, due to the compact nature of the dual-band torque sensor 10, the ambient magnetic field noise ($\epsilon_{dual}$) of the dual-band torque sensor 10 will, as a result, be lower than the ambient magnetic field noise ($\epsilon_{tri}$) of the tri-band torque 10'. As such, the dual-band torque sensor 10 has a higher immunity to ambient magnetic field noise, compared to the tri-band torque sensor 10'.

Thus, the dual-band torque sensor 10 may be more compact and may be more immune to ambient magnetic field noise than the tri-band torque sensor 10'. In this way, the torque sensor 10 may reduce production costs, fit into smaller assemblies, and produce more accurate determinations of the magnitude of the applied torque 34.

Several embodiments have been discussed in the foregoing description. However, the embodiments discussed herein are not intended to be exhaustive or limit the invention to any particular form. The terminology which has been used is intended to be in the nature of words of description rather than of limitation. Many modifications and variations are possible in light of the above teachings and the invention may be practiced otherwise than as specifically described.

The invention claimed is:

1. A torque sensor comprising:
   a shaft configured to receive an applied torque and comprising:
      a first end and an opposing second end and an axis being defined between the first and second ends;
      a first region being magnetoelastic and being configured to generate a first magnetic field in response to the applied torque;
      a second region being magnetoelastic and being configured to generate a second magnetic field in response to the applied torque; and
      a third region disposed between the first region and the second region and being configured to generate a substantially negligible magnetic field in response to the applied torque;
      wherein the first region, the second region, and the third region each comprise a first end and an opposing second end such that a first end of the first region and a second end of the second region defines a length of the first, second, and third region along the axis;
   a first sensor disposed adjacent to the first region and being configured to sense the first magnetic field and an ambient magnetic field;
   a second sensor disposed adjacent to the second region and being configured to sense the second magnetic field and the ambient magnetic field; and
   a third sensor disposed adjacent to the third region and being configured to sense the ambient magnetic field;
   wherein the length of the first, second, and third region along the axis of the shaft is defined as a compressed length, with the compressed length being shorter than an uncompressed length of the regions by a known compression factor, and
   wherein the known compression factor is based on increasing an immunity to noise of the ambient magnetic field of the torque sensor while maintaining an acceptable displacement tolerance of the torque sensor such that:
      an immunity to noise of the ambient magnetic field of the compressed torque sensor is higher than an immunity to noise of the ambient magnetic field of an uncompressed torque sensor, and
      a displacement tolerance of the compressed torque sensor is within a range of acceptable displacement tolerances to maintain an ability to accurately sense the first and second magnetic fields.

2. The torque sensor of claim 1, wherein the applied torque is applied to the shaft of the torque sensor about the axis.

3. The torque sensor of claim 1, wherein the third region is disposed between the first region and the second region such that the first end of the third region contacts the second end of the first region and the second end of the third region contacts the first end of the second region.

4. The torque sensor of claim 3, wherein the length of the first region is substantially equivalent to the length of the second region.

5. The torque sensor of claim 4, wherein the length of the third region is substantially equivalent to the length of the first region and the length of the second region.

6. The torque sensor of claim 1, wherein a magnitude of the applied torque is determinable based on the sensed first magnetic field, the sensed second magnetic field, and the sensed ambient magnetic field by rejecting the ambient magnetic field sensed by the third sensor.

7. The torque sensor of claim 6, wherein the first sensor and the second sensor are further configured to sense the ambient magnetic field and wherein the magnitude of the applied torque is determinable based on the ambient magnetic field sensed by the first sensor and the ambient magnetic field sensed by the second sensor by rejecting the ambient magnetic field sensed by the first sensor, the second sensor, and the third sensor.

8. The torque sensor of claim 1, wherein:
   the first sensor is configured to sense the first magnetic field by sensing a magnitude of an axial or radial component of the first magnetic field; and
   the second sensor is configured to sense the second magnetic field by sensing a magnitude of an axial or radial component of the second magnetic field.

9. The torque sensor of claim 1, wherein the first sensor, the second sensor, and the third sensor are disposed on a housing spaced from and adjacent to the shaft.

10. The torque sensor of claim 1, wherein the known compression factor is $\sqrt{2}$.

11. The torque sensor of claim 1, wherein the range of acceptable displacement tolerances includes 0.05 mm/% signal loss.

12. The torque sensor of claim 1, wherein the range of acceptable displacement tolerances includes 0.1 mm/% signal loss.

13. A vehicular component for determining a magnitude of an applied torque, the vehicular component comprising:
   a mechanism for applying the applied torque;
   a torque sensor comprising:

a shaft configured to receive the applied torque and comprising:
- a first end and an opposing second end and an axis being defined between the first and second ends, wherein the applied torque is applied to the shaft of the torque sensor about the axis;
- a first region being magnetoelastic and configured to generate a first magnetic field in response to the applied torque;
- a second region being magnetoelastic and configured to generate a second magnetic field in response to the applied torque; and
- a third region disposed between the first region and the second region and being configured to generate a substantially negligible magnetic field in response to the applied torque;
- wherein the first region, the second region, and the third region each comprise a first end and an opposing second end such that a first end of the first region and a second end of the second region defines a length of the first, second, and third region along the axis;
- a first sensor disposed adjacent to the first region and being configured to sense the first magnetic field and an ambient magnetic field;
- a second sensor disposed adjacent to the second region and being configured to sense the second magnetic field and the ambient magnetic field; and
- a third sensor disposed adjacent to the third region and being configured to sense the ambient magnetic field;

wherein the length of the first, second, and third region along the axis of the shaft is defined as a compressed length, with the compressed length being shorter than an uncompressed length of the regions by a known compression factor, and wherein the known compression factor is based on increasing an immunity to noise of the ambient magnetic field of the torque sensor while maintaining an acceptable displacement tolerance of the torque sensor such that:
- an immunity to noise of the ambient magnetic field of the compressed torque sensor is higher than an immunity to noise of the ambient magnetic field of an uncompressed torque sensor, and
- a displacement tolerance of the compressed torque sensor is within a range of acceptable displacement tolerances to maintain an ability to accurately sense the first and second magnetic fields; and a controller coupled to the first sensor, the second sensor, and the third sensor of the torque sensor and being configured to determine the magnitude of the applied torque based on the first magnetic field, the second magnetic field, and the ambient magnetic field.

14. The vehicular component of claim 13, wherein the mechanism for applying the applied torque is a mechanism of an electric power steering unit of a vehicle, an engine of a vehicle, or a transmission unit of a vehicle.

15. The vehicular component of claim 13, wherein the first region of the shaft the torque sensor, the second region of the shaft the torque sensor, and the third region of the shaft the torque sensor each comprise a first end and an opposing second end defining a length along the axis, and wherein the third region is disposed between the first region and the second region such that the first end of the third region contacts the second end of the first region and the second end of the third region contacts the first end of the second region.

16. The vehicular component of claim 15, wherein the length of the first region is substantially equivalent to the length of the second region.

17. The vehicular component of claim 13, wherein a magnitude of the applied torque is determinable based on the sensed first magnetic field, the sensed second magnetic field, and the sensed ambient magnetic field by rejecting the ambient magnetic field sensed by the third sensor.

18. The vehicular component of claim 17, wherein the first sensor of the torque sensor and the second sensor of the torque sensor are further configured to sense the ambient magnetic field and wherein the magnitude of the applied torque is determinable based on the ambient magnetic field sensed by the first sensor and the ambient magnetic field sensed by the second sensor by rejecting the ambient magnetic field sensed by the first sensor, the second sensor, and the third sensor.

19. The vehicular component of claim 18, wherein the magnitude of the applied torque is determinable by rejecting the ambient magnetic field sensed by the first sensor, the second sensor, and the third sensor.

20. The vehicular component of claim 13, wherein:
- the first sensor of the torque sensor is configured to sense the first magnetic field by sensing a magnitude of an axial or radial component of the first magnetic field; and
- the second sensor of the torque sensor is configured to sense the second magnetic field by sensing a magnitude of an axial or radial component of the second magnetic field.

* * * * *